United States Patent
Ruoff et al.

(10) Patent No.: US 9,625,827 B2
(45) Date of Patent: Apr. 18, 2017

(54) IMAGING OPTICAL UNIT FOR EUV PROJECTION LITHOGRAPHY

(71) Applicant: Carl Zeiss SMT GmbH, Oberkochen (DE)

(72) Inventors: Johannes Ruoff, Aalen (DE); Josef Rapp, Öpfingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/945,837

(22) Filed: Nov. 19, 2015

(65) Prior Publication Data

US 2016/0147158 A1  May 26, 2016

(30) Foreign Application Priority Data

Nov. 21, 2014  (DE) .................. 10 2014 223 811

(51) Int. Cl.
  *G02B 26/02* (2006.01)
  *G03B 27/32* (2006.01)
  (Continued)

(52) U.S. Cl.
  CPC ............. *G03F 7/702* (2013.01); *G02B 5/005* (2013.01); *G02B 5/0891* (2013.01); *G02B 13/22* (2013.01);
  (Continued)

(58) Field of Classification Search
  CPC ...... G02B 5/005; G02B 5/0891; G02B 13/22; G02B 17/0652; G02B 17/0663;
  (Continued)

(56) References Cited

U.S. PATENT DOCUMENTS 6,445,510 B1  9/2002  Schuster et al.
6,781,671 B2  8/2004  Komatsuda
(Continued)

FOREIGN PATENT DOCUMENTS

DE  10 2008 042 917     4/2009  ............. G02B 17/00
EP   1 768 172 B1        2/2010  ........... H01L 21/027
(Continued)

OTHER PUBLICATIONS

German Examination Report for Application No. 10 2014 223 811.0 dated Jul. 22, 2015.
(Continued)

*Primary Examiner* — Colin Kreutzer
(74) *Attorney, Agent, or Firm* — Fish & Richardson P.C.

(57) ABSTRACT

An imaging optical unit for EUV projection lithography serves to image an object field into an image field. Mirrors guide imaging light from the object field to the image field. An aperture stop is tilted by at least 1° in relation to a normal plane which is perpendicular to an optical axis. The aperture stop has a circular stop contour. In mutually perpendicular planes, a deviation of a numerical aperture $NA_x$ measured in one plane from a numerical aperture $NA_y$ measured in the other plane is less than 0.003, averaged over the field points of the image field. What emerges is an imaging optical unit, in which homogenization of an image-side numerical aperture is ensured so that an unchanging high structure resolution in the image plane is made possible, independently of an orientation of a plane of incidence of the imaging light in the image field.

14 Claims, 19 Drawing Sheets

(51) Int. Cl.

| | |
|---|---|
| *G03B 27/54* | (2006.01) |
| *G03B 27/72* | (2006.01) |
| *G03F 7/20* | (2006.01) |
| *G02B 13/22* | (2006.01) |
| *G02B 17/06* | (2006.01) |
| *G02B 5/00* | (2006.01) |
| *G02B 5/08* | (2006.01) |
| *G21K 1/02* | (2006.01) |
| *G21K 1/06* | (2006.01) |

(52) U.S. Cl.
CPC ..... *G02B 17/0652* (2013.01); *G02B 17/0663* (2013.01); *G02B 26/02* (2013.01); *G03F 7/7025* (2013.01); *G03F 7/70091* (2013.01); *G21K 1/02* (2013.01); *G21K 1/067* (2013.01); *G03F 7/701* (2013.01)

(58) Field of Classification Search
CPC . G02B 26/02; G03F 7/20; G03F 7/702; G03F 7/7025; G03F 7/70091; G03F 7/701; G21K 1/02; G21K 1/067
USPC ............ 250/504 R; 355/67, 71, 77; 359/230, 359/236, 351
See application file for complete search history.

(56) References Cited

U.S. PATENT DOCUMENTS

| | | |
|---|---|---|
| 7,414,781 B2 | 8/2008 | Mann et al. |
| 7,719,772 B2 | 5/2010 | Mann et al. |
| 7,751,127 B2 | 7/2010 | Schuster |
| 8,018,650 B2 | 9/2011 | Mann |
| 8,169,694 B2 | 5/2012 | Mann et al. |
| 8,810,903 B2 | 8/2014 | Mann |
| 2003/0076483 A1 | 4/2003 | Komatsuda |
| 2006/0012767 A1* | 1/2006 | Komatsuda ........ G02B 17/0657 355/67 |
| 2007/0223112 A1 | 9/2007 | Mann et al. |
| 2008/0165426 A1 | 7/2008 | Schuster |
| 2008/0315134 A1 | 12/2008 | Ehm et al. |
| 2009/0051890 A1* | 2/2009 | Mann ................. G03F 7/70233 355/67 |
| 2010/0149509 A1 | 6/2010 | Shiraishi et al. |
| 2010/0231885 A1 | 9/2010 | Mann |
| 2012/0069314 A1 | 3/2012 | Zellner et al. |
| 2012/0188525 A1 | 7/2012 | Mann et al. |
| 2012/0274917 A1 | 11/2012 | Mann et al. |
| 2013/0070227 A1 | 3/2013 | Mueller et al. |
| 2013/0088701 A1 | 4/2013 | Mann et al. |
| 2013/0342821 A1 | 12/2013 | Mann |

FOREIGN PATENT DOCUMENTS

| | | | |
|---|---|---|---|
| WO | WO 2004/046771 | 6/2004 | ............... G02B 5/00 |
| WO | WO 2010/091800 | 8/2010 | ............... G03F 7/20 |
| WO | WO 2010/115500 | 10/2010 | ............. G02B 17/06 |
| WO | WO 2012/137699 | 10/2012 | ........... H01L 21/027 |
| WO | WO 2013/174686 | 11/2013 | ............. G02B 17/06 |
| WO | WO 2014/000970 | 1/2014 | ............... G03F 7/20 |

OTHER PUBLICATIONS

Yang et al., "Effect of central obscuration on image formation in projection lithography", *SPIE*, vol. 1264, pp. 477-485 (1990).
Extended European Search Report for European Application No. 15195078.9 dated Mar. 17, 2016 (9 pages).

* cited by examiner

IMAGING OPTICAL UNIT FOR EUV PROJECTION LITHOGRAPHY

The contents of German patent application DE 10 2014 223 811.0 is incorporated by reference. In the event of conflict, the present specification controls.

FIELD OF THE INVENTION

The invention relates to an imaging optical unit for EUV projection lithography. Furthermore, the invention relates to an optical system with such an imaging optical unit, a projection exposure apparatus with such an optical system, a production method for a microstructured or nanostructured component using such a projection exposure apparatus and a microstructured or nanostructured component produced therewith, in particular a semiconductor chip, for example a memory chip.

BACKGROUND

An imaging optical unit for EUV projection lithography is known from US 2007/0 223 112 A1, U.S. Pat. No. 6,781,671, US 2010/0 149 509 A1, WO 2012/137 699 A1, US 2012/0069314 A1, EP 1 768 172 B1, WO 2004/046 771 A1 and U.S. Pat. No. 7,751,127. The configuration of a system stop for an imaging optical unit is known from U.S. Pat. No. 6,445,510 B1.

SUMMARY

It is an object of the disclosed technology to ensure a homogenization of an image-side numerical aperture using the imaging optical unit so that an unchanging high structure resolution in the image plane is made possible, independently of the field location and of an orientation of an image-side plane of incidence of the imaging light.

In general, in a first aspect, the invention features an imaging optical unit for EUV projection lithography for imaging an object field in an object plane into an image field in an image plane, the imaging optical unit including a plurality of mirrors for guiding imaging light from the object field to the image field, and an aperture stop, which is tilted by at least 1° relative to a normal plane on which is perpendicular to an optical axis. The aperture stop is configured with a circular stop contour and is arranged in such a way that the following applies to mutually perpendicular planes: a deviation of a numerical aperture $NA_x$ measured in one of these planes from a numerical aperture $NA_y$ measured in the other one of these two planes is less than 0.003, averaged over the field points of the image field.

A tilt of the aperture stop in relation to the normal plane which is perpendicular to the optical axis constitutes a previously unused degree of freedom for homogenizing the image-side numerical aperture. By means of such a tilted aperture stop, it is possible, in particular, to set the maximum illumination angle for an image point in the image field virtually independently of the direction of incidence and the image point position in the image field. The tilt renders it possible to variably predetermine the maximum illumination angle in a variation plane perpendicular to the tilt axis of the aperture stop by way of the respective tilt angle, independently of a plane perpendicular thereto containing the tilt axis. Hence, tilting the aperture stop relative to the normal plane ensures a change in a width corresponding to the projection of the diameter of the aperture stop in the normal plane in one of two dimensions spanning the aperture stop and hence a change in the numerical aperture predetermined by way of the width in this plane. This degree of freedom of a tilt of the aperture stop relative to the normal plane enables a homogenization of the numerical apertures, in particular in the case of off-axis fields and/or in the case of e.g. axial fields with an aspect ratio differing from 1, and therefore enables an equalization of a maximum angle of incidence, independently of the direction of incidence. Therefore, the illumination angle is defined by way of two angle coordinates, namely one angle which characterizes the illumination direction in the respectively present plane of incidence and a second angle which characterizes an azimuth orientation of the image-side plane of incidence. The homogenization of the numerical apertures $NA_x$, $NA_y$ for the two mutually perpendicular planes, which are spanned by the z-axis parallel to the optical axis and an x-axis and by the z-axis and a y-axis lying in a meridional plane, is explained in detail in EP 1 768 172 B1 as an imaging parameter to be optimized. In order to characterize this homogenization, i.e. the deviation between the numerical apertures $NA_x$ and $NA_y$, use can be made of the image field-side numerical aperture. The aperture stop with the circular edge can be manufactured in a cost-effective manner. A diameter of the circular aperture stop can have a variable configuration, for example in the style of an iris diaphragm. The diameter can be modifiable in a predetermined manner with the aid of an appropriate drive. The tilt of the circular aperture stop in relation to the normal plane on the optical axis has been found to be particularly suitable, for example for adapting the numerical aperture $NA_x$ and $NA_y$. The optical axis is a common axis of rotational symmetry of the mirrors of the imaging optical unit. This assumes a configuration of the mirrors with rotationally symmetric reflection surfaces or with substantially rotationally symmetric reflection surfaces, i.e. apart from nano-asphere corrections. Such a configuration of the mirrors is not mandatory for all mirrors of the imaging optical unit. To the extent that mirrors with non-rotationally symmetric reflection surfaces are used in the imaging optical unit, the optical axis is understood to mean a reference axis which is defined by the remaining rotationally symmetric mirrors or by rotationally symmetric reference surfaces with the best fit to the non-rotationally symmetric reflection surfaces. In addition to homogenization of the numerical aperture, the tilt of the circular stop can also lead to an improvement of the telecentricity and/or ellipticity and/or trefoil imaging parameters. As a result of the homogenization, the deviation of the numerical aperture $NA_x$ from the numerical aperture $NA_y$, averaged over the field points of the image field, can be less than 0.003, less than 0.001, less than 0.0005 or e.g. 0.0002. An even smaller deviation in the region of 0.0001 is also possible. The deviation can be 0.00001.

Strictly speaking, the homogenization of the numerical apertures $NA_x$ and $NA_y$ over all field points in an image field, explained above, only relates to planes in the x-direction or y-direction. In particular, such a homogenization is advantageous for imaging H-lines or V-lines, i.e. for lines of an object structure to be imaged which extend parallel to the x-axis or parallel to the y-axis. The homogenization can also apply to different planes of incidence with arbitrary azimuth angles, i.e. to planes of incidence which have a finite angle in relation to the xz-plane of incidence or in relation to the yz-plane of incidence. Such a homogenization, even for planes of incidence tilted correspondingly in relation to the xz-plane or yz-plane, can be implemented, in particular, if structures which extend in the direction of a corresponding azimuth angle or perpendicular thereto are imaged.

In some embodiments, a stop arrangement departs from the prescription of an arrangement of the stop plane in a manner coinciding with crossing points of individual imaging rays assigned to fixed illumination directions of various field points. It was found that an arrangement of the tilted circular aperture stop departing from the arrangement in the coma plane or the arrangement in a chief ray crossing plane can lead to a further improvement of imaging parameters.

A corresponding statement applies to a decentration of the arrangement of the aperture stop. In order to define the coma plane and the chief ray crossing plane, the coma rays used in this document are defined below. Here, a distinction is made between free coma rays and bounding coma rays.

Here, free coma rays are the rays which are transferred with maximum aperture from an off-axis article point or object point in an article plane or else object plane to an image point in the image plane by means of the imaging optical unit, with the rays intersecting at the image point also having a maximum aperture. Here, the maximum aperture of the rays intersecting at the image point, the aperture NA, is predetermined as nominal variable or setpoint value for the imaging optical unit, with, initially, no aperture stop limiting the setpoint value of the numerical aperture NA. The free coma rays are established by virtue of a telecentric centroid ray profile being assumed for each image point for the imaging beams of the image points in the image plane. Using these conditions of numerical aperture NA and telecentricity, an imaging beam to the associated object point is established for each image point, proceeding from the image points in the image plane against the projection direction of the imaging optical unit in the direction of the object plane. The rays bounding this imaging beam are referred to as free coma rays or, more simply, as coma rays below. If the coma rays are bounded by a stop—an aperture stop—the rays which just pass the edge of the stop are also referred to as bounding coma rays.

The free coma rays of different article points or image points intersect along a three-dimensional intersection line, which virtually form a circle for paraxial image points, with all free coma rays of the image points approximately extending through this circle. For off-axis image points, a closed three-dimensional intersection line emerges for respectively two image points, along which three-dimensional intersection lines the free coma rays intersect, with this intersection line usually varying with the considered image points. The imaging beams of all image points of the image field provide a waist region of the imaging beam from the sum of the intersection lines. This waist region is generally referred to as a pupil. A coma plane for two image points emerges as a plane with the best fit to the sum of the intersection lines. In order to determine this plane with the best fit, i.e. in order to determine the coma plane, the three-dimensional intersection line can be averaged in such a way that the integral of the squared perpendicular distances of the intersection line along this line on the coma plane is minimal. Alternatively, it is also possible to use the distance or the magnitude of the distance for minimization when determining the coma plane. If more than two image points are considered, the coma plane emerges as that plane in which the sum of all integrals of the aforementioned type becomes minimal over all intersection lines. Below, the coma plane is also referred to as pupil plane.

Below, a distinction is made between chief ray plane and chief ray crossing plane.

The chief ray plane emerges as a plane perpendicular to the optical axis, which extends through the intersection point of a chief ray of an off-axis object point with the optical axis. For paraxial object points, the chief ray is virtually identical to the centroid ray of the imaging light beam, which transfers the object point in an object plane into an image point in an image plane with the maximum aperture angle by means of the imaging optical unit. Here, the chief ray of the imaging light beam can initially extend parallel to the optical axis as far as the first mirror. Likewise, the chief ray can also extend parallel to the optical axis after the last mirror of the imaging optical unit. For off-axis object points, the chief ray can deviate from the centroid ray. Furthermore, different intersection points of the chief rays emanating from these object points with the optical axis emerge for different object points. The chief ray plane is defined as the plane with the best fit in relation to these intersection points that is vertical to the optical axis. The chief ray plane is that plane perpendicular to the optical axis for which the integral of the squared distance of a chief ray intersection point from the plane becomes minimal, wherein the integral is to be formed over all intersection points of chief rays of field points of an object field with the optical axis. The chief ray plane is also referred to as paraxial pupil plane.

The centroid ray is that imaging ray in a light beam which transfers an object point in the object plane into an image point in an image field plane by means of the imaging optical unit, which centroid ray extends through the energy-weighted centre in a plane perpendicular to the direction of propagation thereof, which centre emerges by integrating the light intensities of the aforementioned light beam in this plane.

The chief ray crossing plane is a plane parallel to the coma plane. The chief ray crossing plane in this case extends through the region in which all chief rays of the imaging beams assigned to the image points under the aforementioned conditions of NA setpoint value and the image-side telecentricity intersect, or in which the sum of these imaging beams has the narrowest cross section thereof. That is to say, the chief ray crossing plane is tilted about the intersection point of the chief ray plane with the optical axis, determined like above by averaging, in such a way that it extends parallel to the coma plane.

Both the free coma rays and the chief rays constitute an ideal case in the following figures. There, boundary or free coma rays or centre rays or chief rays for beams which extends exactly in the telecentric manner for all field points are shown. Moreover, these rays extend in the image plane with a predetermined numerical aperture of the imaging optical unit.

An orientation of a tilt axis for the aperture stop relative to an object displacement direction was found to be particularly suitable. An object displacement drive can be provided for displacing the object through the object field along the object displacement direction.

Certain values of the tilt angles of the aperture stopwere found to be particularly suitable for achieving the object of good homogenization of the numerical aperture. The tilt angle can be at least 2.5°, can be at least 3° or else can be even larger. The tilt angle can be smaller and can be 1.1°. The tilt angle can be 8.6°. The tilt angle can be 13°. The tilt angle can lie in the range between 5° and 15°. The tilt angle can lie in the range between 1° and 3°.

Certain orientations of a tilt relative to the angle of the optical axis relative to the chief ray of the central field point were found to be suitable for improving imaging parameters, depending on the design of the imaging optical unit. What emerged unexpectedly here is that in fact both orientations can bring about an improvement, depending on the design of the imaging optical unit.

A planar stop configuration can likewise be manufactured in a cost-effective manner. Alternatively, the aperture stop can be designed in such a way that it follows the form of a pupil of the imaging optical unit, which may deviate from the planar design, in three dimensions.

A configuration of at least one mirror of the imaging optical unit as a free-form surface increases the degrees of freedom for the imaging optical unit. All mirrors of the imaging optical unit can be configured as free-form surfaces. Examples of free-form surface designs which can be used within projection optical unit designs are found in WO 2013/174 686 A1 and the references cited there.

In some embodiments, a drive increases the adaptation possibilities for the imaging optical unit. The image-side numerical aperture can be predetermined exactly and with a sufficient number of degrees of freedom by way of the tilt drive and the optionally likewise present drive for setting the stop diameter.

Further aspects of the technology relate to the improvement of imaging parameters of an imaging optical unit when instead of using a titled circular stop, an elliptical stop is used, which is displaced along a reference axis, which may be the optical axis, or perpendicular thereto, in particular parallel to an object displacement direction, for the purposes of optimizing parameters. These further aspects can be combined with the features explained above.

Imaging optical units of the first aspect may be incorporated in an optical system for a projection exposure apparatus, used in production of microstructured or nanostructured components.

Exemplary embodiments are explained in more detail below.

DETAILED DESCRIPTION

Figure 1:
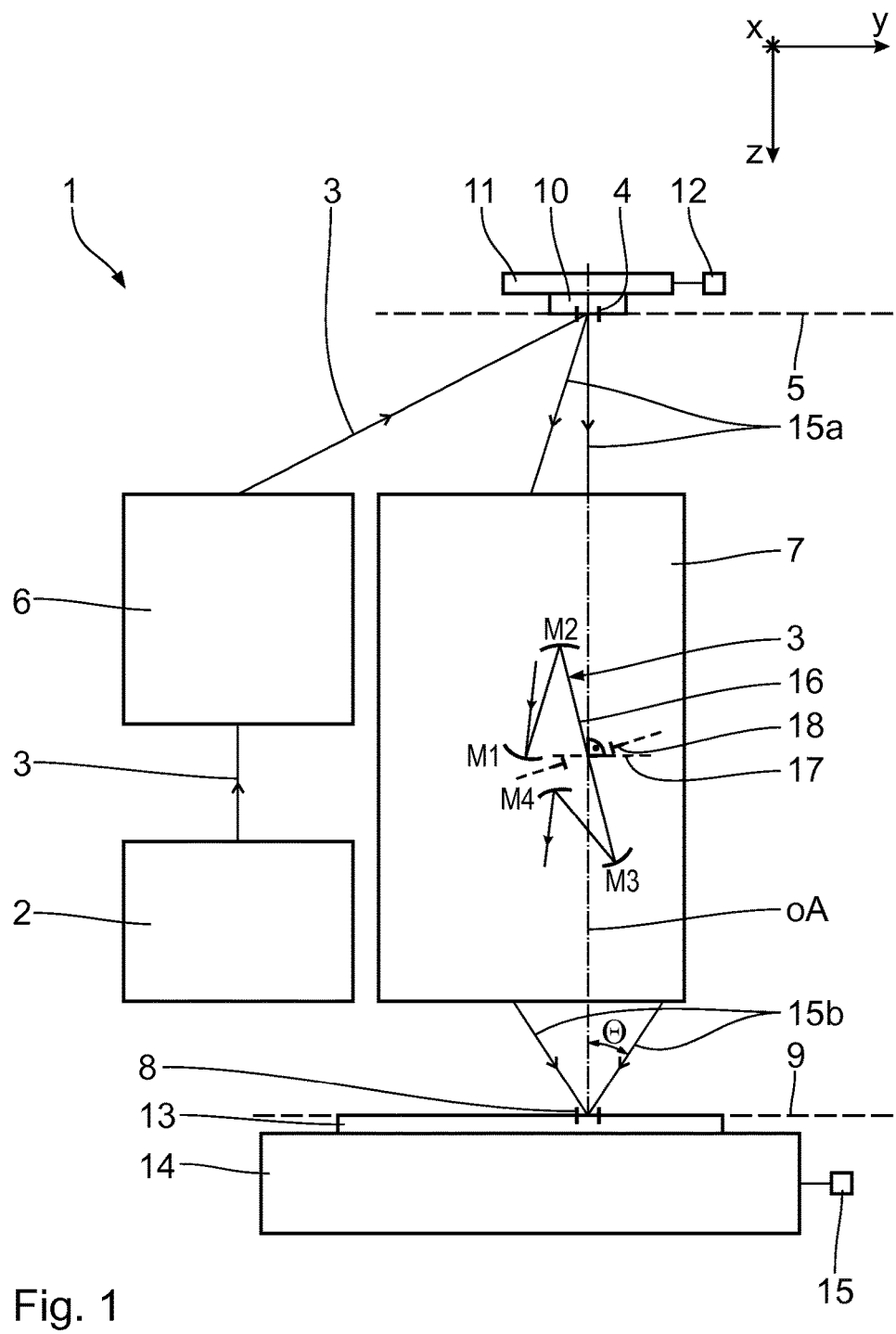
FIG. 1 schematically shows a projection exposure apparatus for EUV microlithography.

A projection exposure apparatus 1 for microlithography includes a light source 2 for illumination light or imaging light 3. The light source 2 is an EUV light source, which generates light in a wavelength range of e.g. between 5 nm and 30 nm, in particular between 5 nm and 15 nm. In particular, the light source 2 can be a light source with a wavelength of 13.5 nm or a light source with a wavelength of 6.9 nm. Other EUV wavelengths are also possible. A beam path of the illumination light 3 is depicted very schematically in FIG. 1.

An illumination optical unit 6 serves to guide the illumination light 3 from the light source 2 to an object field 4 in an object plane 5. Using a projection optical unit or imaging optical unit 7, the object field 4 is imaged into an image field 8 in an image plane 9 with a predetermined reduction scale. The projection optical unit 7 according to FIG. 2 for example has a reduction by a factor of 4. Other reduction scales are also possible, e.g. 5×, 6×, or 8×, or else reduction scales with a magnitude greater than 8× or with a magnitude smaller than 4×, e.g. 2× or 1×. In the projection optical unit 7, the image plane 9 is arranged parallel to the object plane 5. A portion of a reflection mask 10, which is also referred to as reticle, coinciding with the object field 4 is imaged in this case. The reticle is supported by a reticle holder 11 depicted schematically in FIG. 1, which is displaceable by way of a reticle displacement drive 12, which is likewise depicted in a schematic manner.

The imaging by the projection optical unit 7 is implemented onto the surface of a substrate 13 in the form of a wafer, which is supported by a wafer holder or a substrate holder 14. The wafer holder 14 is displaced by way of a wafer displacement drive 15, which is likewise depicted schematically in FIG. 1. Between the reticle 10 and the projection optical unit 7, FIG. 1 schematically depicts a beam 15a of the illumination light 3 entering therebetween and, between the projection optical unit 7 and the substrate 13, a beam 15b of the illumination light 3 exiting from the projection optical unit 7. The illumination light 3 imaged by the projection optical unit 7 is also referred to as imaging light. The imaging rays 15b at the edge, which are incident on the image field 8, are imaging rays which ideally belong to the same absolute illumination angles of the illumination of the image field 8. The maximum angle of the exiting beam 15b in relation to the optical axis is a polar angle $\Theta$. $\Theta$ therefore is the angle of incidence in a plane of incidence, which has an optical axis oA and a coma ray of the beam 15b. $\Theta$ ideally does not depend on the azimuth angle about the optical axis oA, i.e. on the direction of the plane of incidence. In reality, the angle of incidence $\Theta$ is a function of an azimuth angle in the image plane 9. The numerical aperture, and hence the variable determining the resolution capability of the imaging optical unit, for example of the projection lens according to FIG. 1, emerges as $NA=n*\sin \Theta$, which is a function of the azimuth angle in the image plane 9, particularly when imaging off-axis image points or an off-axis image field 8, i.e. $NA[azimuth]=n*\sin[\Theta(azimuth)]$. Here, n is the refractive index of the medium through which the exiting beam 15b propagates.

Figure 2:
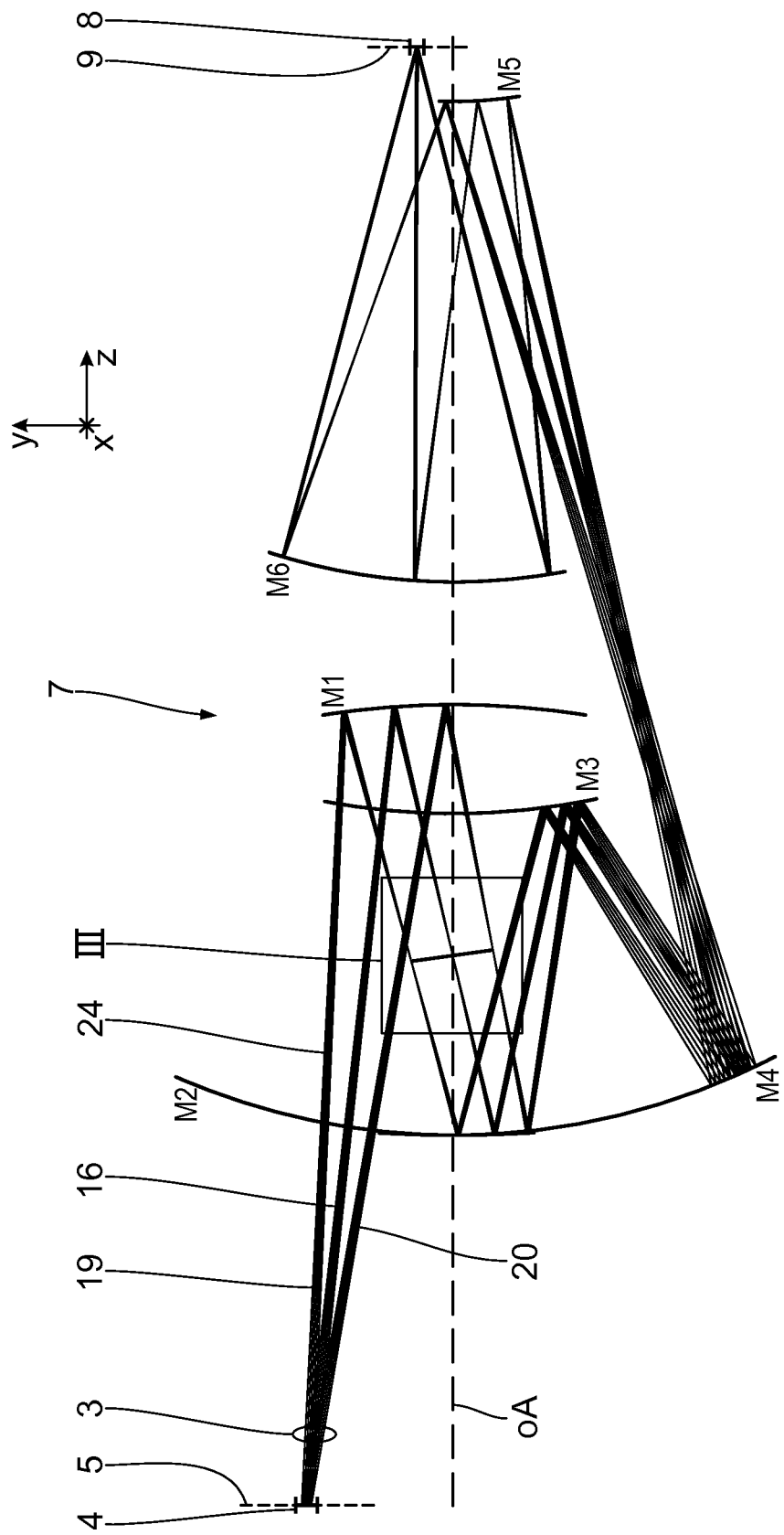
FIG. 2 shows a meridional section of an imaging optical unit of the projection exposure apparatus for imaging an object field into an image field, wherein the imaging optical unit has a tilted circular stop.

By way of example, an image field-side numerical aperture of the projection optical unit 7 in the embodiment according to FIG. 2 is 0.26. This is not reproduced true to scale in FIG. 1. The image field-side numerical aperture can for example lie in the range between 0.2 and 0.7, depending on the embodiment of the projection optical unit 7.

In order to facilitate the description of the projection exposure apparatus 1 and the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction runs toward the right and the z-direction runs downward.

The projection exposure apparatus 1 is of the scanner type. Both the reticle 10 and the substrate 13 are scanned in an object displacement direction parallel to the y-direction by a synchronized displacement by way of the displacement drives 12 and 15 during the operation of the projection exposure apparatus 1. A stepper type of the projection exposure apparatus 1, in which a stepwise displacement of the reticle 10 and of the substrate 13 in the y-direction takes place between individual exposures of the substrate 13, is also possible.

Both the object plane 5 and the image plane 9 respectively extend parallel to the xy-plane.

FIG. 1 depicts very schematically part of a beam path of the imaging light 3 between the object field 4 and the image field 8. What is shown is the beam path of a chief ray 16 of a central field point of the projection optical unit 7 routed over reflections at four mirrors M1, M2, M3 and M4 of the projection optical unit 7. This beam profile is merely indicated very schematically in FIG. 1 in order to sketch out the region around an aperture stop 18 which is still to be explained below. In addition to the mirrors M1 to M4, the projection optical unit 7 can have further mirrors and, for example, can have a total of six, eight or ten mirrors M1, . . . . The location, size and tilt of the mirrors M1 to M4 are merely shown schematically in FIG. 1 for indicating the beam path of the imaging light 3, which generally has a different detailed route. At least one of the mirrors M1, M2, . . . can have a reflection surface that is embodied as a free-form surface.

The chief ray 16 crosses the optical axis oA of the projection optical unit 7 in the beam path between the mirrors M2 and M3, wherein, for example, the mirror M1 is the first mirror of the projection lens 7 in the beam path downstream of the reticle 10. The optical axis oA constitutes a reference axis, on the basis of which a mathematical representation of the optically used surfaces of the mirrors M1, M2, . . . of the projection optical unit 7 is possible. In particular, the reference axis can be an axis of rotational symmetry of these optical surfaces. The reference axis can lie in a symmetry plane of the imaging optical unit 7. A crossing point of the chief ray 16 with the optical axis oA lies in a pupil plane 17 of the projection optical unit 7 in the case of paraxial imaging. In order to distinguish this pupil plane 17 from the pupil plane defined at the outset by the coma plane, it is denoted as paraxial pupil or paraxial pupil plane below. The optical axis oA is perpendicular to a normal plane, which may coincide with the paraxial pupil plane 17, which is why the reference sign 17 is also used for the normal plane below. The aperture stop 18 of the projection optical unit 7 is arranged in the region of this crossing point of the optical axis oA with the beam path of the chief ray 16 between the mirrors M2 and M3. The aperture stop 18 is configured as a planar stop.

This aperture stop 18 serves to predetermine a homogenized image-side numerical aperture NA such that the image-side numerical apertures $NA_x$ perpendicular to the plane of the drawing of FIG. 1 and $NA_y$ in the plane of the drawing of FIG. 1 are as equal as possible for all image points, i.e. $NA_x=NA_y$, should be satisfied to the best possible extent. It is possible to achieve homogenization of the numerical aperture in the case of a typical numerical aperture NA of 0.25, in which the values between $NA_x$ and $NA_y$ of this numerical aperture NA vary by no more than 0.0025. An image-side numerical aperture shown in the plane of the drawing of FIG. 1 corresponds to the value $NA_y$, since the numerical aperture in the yz-plane is depicted here. An image-side numerical aperture $NA_x$ emerges in the xz-plane perpendicular thereto.

FIG. 2 elucidates an actual course of imaging rays in the imaging optical unit 7 between the object field 4 and the image field 8, which both lie at a distance from the optical axis oA, i.e. constitute off-axis fields. What is shown in FIG. 2 is the course of individual rays 24 of the imaging light 3, which belong to five field points spaced apart from one another along the y-axis, wherein respectively one chief ray 16 and coma rays 19, 20 emanate from each one of these field points. As mentioned above, the chief rays and (free) coma rays for the ideal case of a setpoint aperture NA=0.25 are depicted in this case, with the beams forming an image point extending telecentrically in the image plane 9.

The basic design and the optical design data of the imaging optical unit 7 according to FIG. 2 are known from EP 1 768 172 B1, apart from the exact course of the imaging rays and, even more critically, the configuration and arrangement of the aperture stop 18. The optical axis oA of the imaging optical unit 7 is the axis of rotational symmetry of the description of the surface of mirror surfaces of the mirrors M1 to M6 of the imaging optical unit 7.

Figure 3:
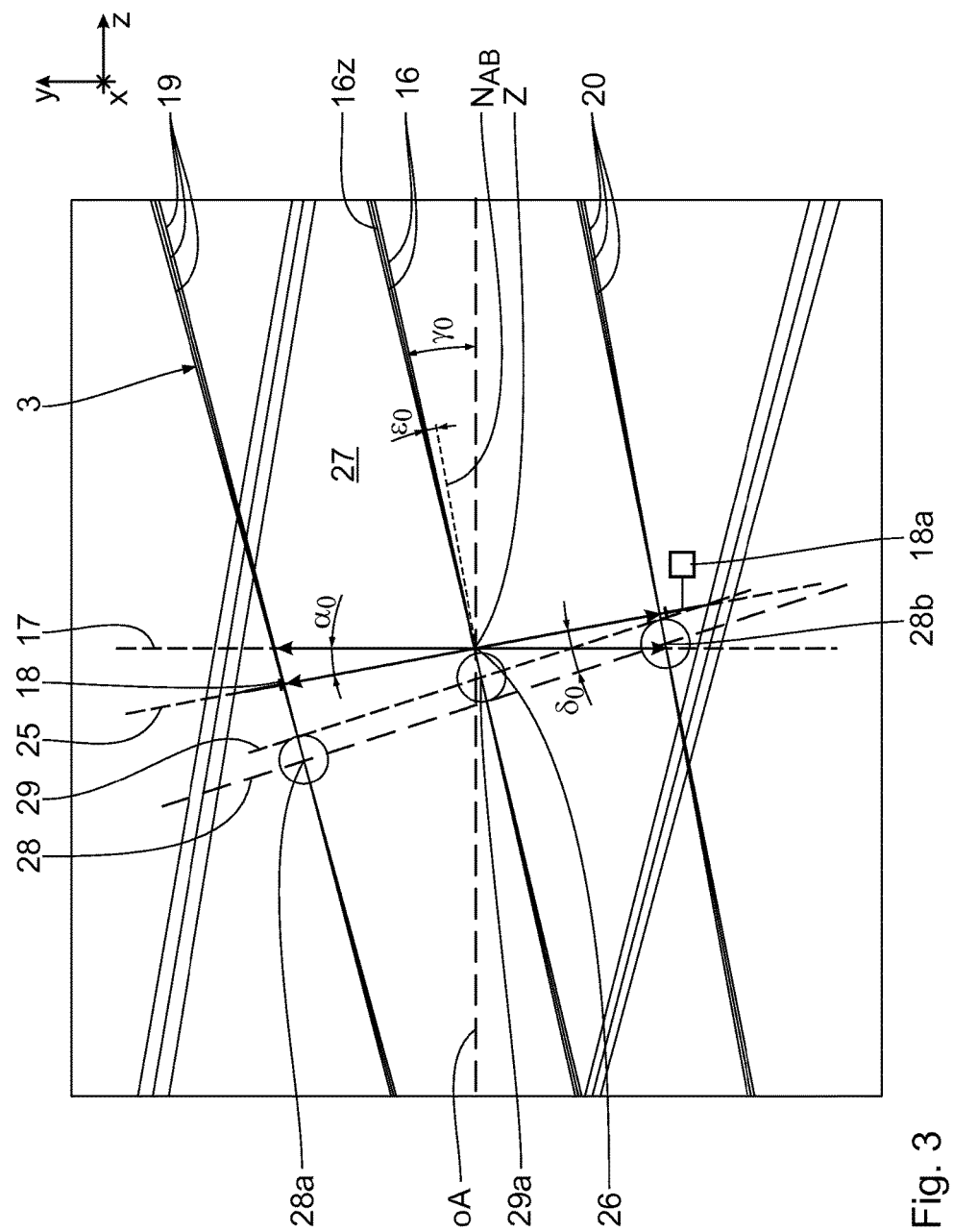
FIG. 3 shows a sectional magnification of the detail III in FIG. 2 in the region of the tilted circular stop.

FIG. 3 shows details in respect of the precise arrangement of the aperture stop 18, which is arranged in a stop plane 25. Here, the section III from FIG. 2 is depicted in a magnified manner. The calculation of the beam paths depicted in FIG. 2 and FIG. 3 (and also for the following figures which show the course of imaging beams) was initially carried out without a stop and with a constant numerical aperture $NA_x=NA_y=0.25$ for the depicted image points in order initially to depict the ray route of the beams without a stop in the case of these aperture and telecentricity conditions. After inserting the real stop 18, the latter modifies the beams extending through the imaging optical unit 7 in such a way that these intersect in the region of the edge of the stop; this has not been depicted so as to provide a better overview.

Unlike in the configuration according to EP 1 768 172 B1, the aperture stop 18 has a circular configuration with a diameter of 66.254 mm. In relation to the normal plane 17 on the optical axis oA, the stop plane 25 is tilted by a tilt angle $\alpha_0$, the magnitude of which in the embodiment according to FIG. 2 and FIG. 3 is approximately 13°. This tilt is implemented about a tilt axis 26. The tilt axis 26 is perpendicular to the yz-plane, i.e. perpendicular to a tilt normal plane 27, which contains the object displacement direction y and in relation to which the field planes, i.e. the object plane 5 and the image plane 9, are perpendicular. The tilt normal plane 27 coincides with the meridional plane of the imaging optical unit 7. In principle, other magnitudes of the tilt angle $\alpha_0$ in the region of between 10° and 16° are also possible and can lead to an imaging performance of the projection optical unit that is improved over EP 1 768 172 B1, as will still be explained in conjunction with the example in FIGS. 6 to 9.

This tilt about the tilt axis 26 through the tilt angle $\alpha_0$ is brought about in an anticlockwise direction in the orientation of FIG. 3. In the embodiment according to FIGS. 2 and 3, the tilt of the circular aperture stop 18 is such that an angle co of a stop normal $N_{AB}$ in relation to a chief ray $16_z$ of a central field point is reduced in comparison with the angle $\gamma_0$ of the optical axis oA in relation to this chief ray $16_z$ of the central field point. In this case, $\alpha_0<0$. $\epsilon_0=\gamma_0+\alpha_0$ applies. The angle $\gamma_0$ simultaneously is the angle between a normal plane s (cf. the subsequent FIG. 4) in relation to the chief ray 16 and the stop plane 25. Within this meaning, the circular aperture stop 18 is thus tilted relative to the overall beam of the imaging light 3 in such a way that a projection of an area bounded by the aperture stop 18, as seen in the direction of the beam profile of this beam of the imaging light 3, is enlarged compared to a positioning of the circular aperture stop 18 perpendicular to the optical axis oA.

Figure 4:
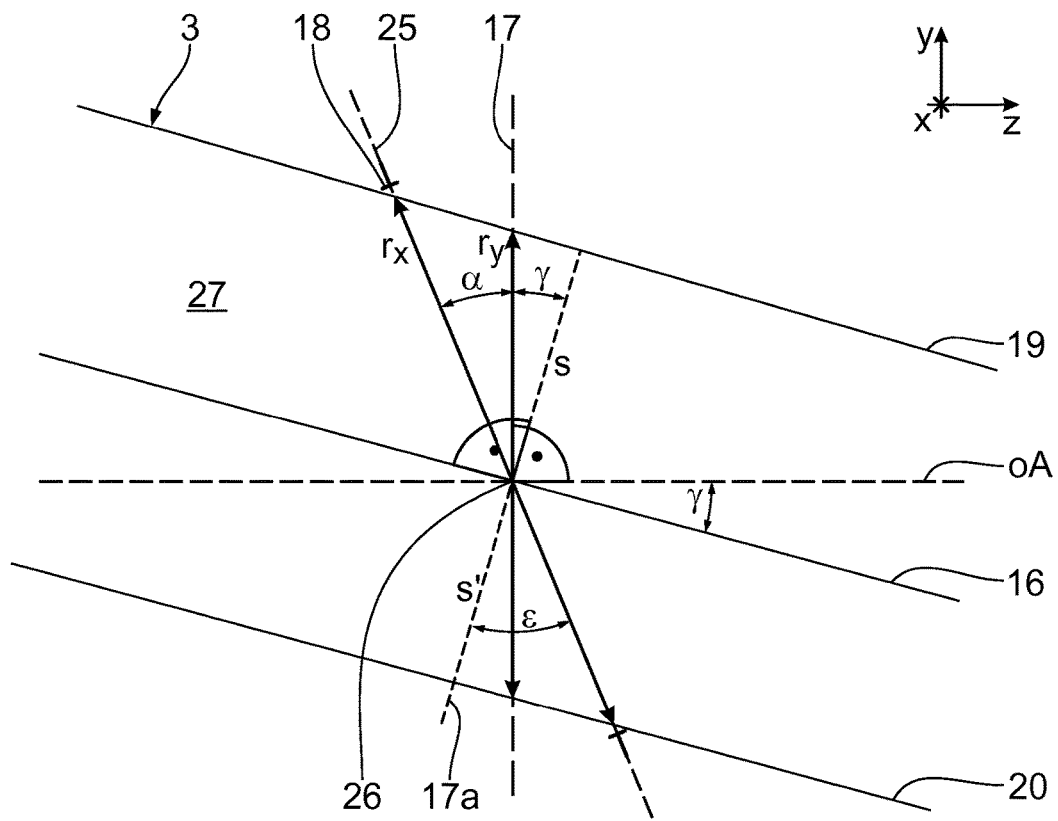
FIG. 4 schematically shows an imaging light beam profile in the region of a circular aperture stop for elucidating used parameters.

For the purposes of a more detailed explanation of the tilt angle situation for a tilted circular aperture stop, FIG. 4 shows, in a schematic manner and in extracts, a light beam 3 through an imaging optical unit, e.g. a projection lens, which images an object point into an image point, in a region in which a chief ray 16 intersects the optical axis oA which extends along a z-axis. Depicted are an upper coma ray 19, a lower coma ray 20 and the chief ray 16 of the light beam 3 in a yz-plane, which forms a meridional plane of the optical unit. The light beam 3 has a radius s in the depicted projection. The latter emerges from the distance between the upper coma ray 19 and the intersection point of the chief ray 16 with the optical axis oA, wherein the distance s is measured perpendicular to the chief ray 16 and wherein the chief ray 16 intersects the optical axis under the angle γ. A plane perpendicular to the optical axis oA through this intersection point of chief ray 16 and optical axis oA is denoted as paraxial pupil plane 17, as described above. The paraxial pupil plane 17 intersects the upper coma ray 19 in such a way that a distance $r_y$ emerges in the y-direction perpendicular to the optical axis oA, wherein this direction e.g. corresponds to the object displacement direction in the case of a projection lens. A stop perpendicular to the optical axis oA with this radius $r_y$ in the y-direction would bound the light beam 3 in the depicted manner. The paraxial pupil plane 17 and a plane 17a perpendicular to the chief ray through the intersection point between the chief ray 16 and the optical axis oA are tilted against one another by the angle γ. In the case where the upper coma ray 19 and the chief ray 16 extend parallel to one another, the upper coma ray 19 is also perpendicular to the radius s. A radius s' of the light beam 3 in the direction of the lower coma ray 20 is generally different from the above-described radius s in the direction of the upper coma ray 19.

If the light beam 3 has a radius $r_x$ that differs from s in the x-direction (direction perpendicular to the plane of the drawing), which radius equals the distance of the coma ray, not depicted in this direction, from the intersection point of the chief ray and the optical axis in the x-direction, wherein this distance is once again determined perpendicular to the chief ray 16, the light beam cross section differs from the circular form.

If $r_x$ is greater than s, the light beam depicted in FIG. 4 can be bounded by means of a circular planar stop with a radius $r_x$ if the latter is rotated or tilted about an axis of rotation 26 parallel to the x-axis through the intersection point between the chief ray 16 and the optical axis oA, through an angle α in relation to the paraxial pupil plane 17, which extends through said intersection point. If $r_x$ is greater than $r_y$ in this case, a is greater than zero. The circular stop 18 is therefore tilted in the anticlockwise direction compared with the location of the stop perpendicular to the optical axis oA in FIG. 4. With the angle ε, introduced in the context of FIG. 3, for the angle of the stop normal in relation to the chief ray 16, which has an angle γ relative to the optical axis, ε=γ+α applies, with α>0. By contrast, if $r_x$ were smaller than $r_y$, i.e. in a case not depicted in FIG. 4, a is less than zero. In this case, the relationship ε=γ+α also applies, with α<0. This case was explained above in conjunction with FIG. 3.

The following relationships: $\cos(\gamma)=s/r_y$; $\cos(\gamma+\alpha)=s/r_x$ emerge from FIG. 4, as result of which $r_y/r_x=\cos(\gamma+\alpha)/\cos(\gamma)$ emerges. Using this, it is possible to establish the tilt angle α in the case of a predetermined diameter $r_x$ of the circular stop and a predetermined distance value $r_y$.

It is mentioned that the light beam depicted in FIG. 4 cannot be bounded by a tilted circular planar stop in such a way that a setpoint value for the numerical aperture in the x-direction and y-direction is to be approximately equal, as averaged over all field point of the image field, for an imaging optical unit with a light beam 3 where $r_x$ is less than s. However, in this case, the stop can be approximated by an elliptic stop, the semi-minor axis of which perpendicular to the meridional plane points in the direction of the axis of rotation which extends through the intersection point of chief ray HS and optical axis oA. By way of example, this direction is perpendicular to the optical axis and perpendicular to the object displacement direction in the case of a lithographic projection lens. The semi-major axis of the elliptic stop is determined by the tilt angle γ and the spacing of the coma rays 19, 20 to be observed. This semi-major axis emerges, for example, by optimizing the image-side telecentricity and the image-side numerical apertures $NA_x$ and $NA_y$, which should be as equal as possible for all image points.

It should be mentioned that the centre point of the tilted circular stop 18, or, in accordance with a further aspect, of the elliptic tilted stop 18 can be displaced from the above-described axis of rotation or tilt axis by e.g. up to ±2 mm in the direction of the optical axis oA, i.e. in the z-direction. Using this it is possible, in particular, to optimize an x-telecentricity, as will still be shown on the basis of the following exemplary embodiments. Furthermore, a centre point or centre of these stops 18 in the y direction, i.e. in the object displacement direction, can be displaced by e.g. ±1 mm. By way of this displacement, it is possible, in particular, to optimize a y-telecentricity, which will likewise still be shown below.

A mean numerical aperture of $NA_{y\_av}=0.24297$ emerges for the projection lens described in EP 1 768 172 B1 for a non-tilted, circular aperture stop with a diameter of $r_x=66.254$ mm, which is arranged parallel to the object displacement direction, i.e. perpendicular to the optical axis oA. The mean numerical aperture in the x-direction is $NA_{x\_av}=0.24952$, and so a mean deviation of $NA_{x\_av}-NA_{y\_av}=0.00655$ emerges. A mean numerical aperture of $NA_{y\_av}=0.25058$ emerges when use is made of the elliptic stop depicted in EP 1 768 172 B1, which has a semi-major axis in the object displacement direction of $r_y=68.348$ mm and a semi-minor axis perpendicular to the optical axis and perpendicular to the object displacement direction of $r_x=66.254$ mm, hence resulting in a ratio of $r_y/r_x=1.032$. The mean numerical aperture in the x-direction in this case is also $NA_{x\_av}=0.24952$, and so a mean deviation of $NA_{x\_av}-NA_{y\_av}=0.00106$ emerges. This is an improvement by approximately a factor of 6 compared to the first mentioned, non-tilted circular stop. If the planar circular stop is tilted by approximately −13°, as depicted in FIGS. 2 and 3, a mean numerical aperture of $NA_{y\_av}=0.24889$ is obtained in the case of a tilt angle of −12.9°. Here, the mean numerical aperture in the x-direction is $NA_{x\_av}=0.24984$, and so a mean deviation of $NA_{x\_av}-NA_{y\_av}=0.00095$ emerges, constituting an improvement in the mean deviation of the numerical aperture by approximately a factor of 7 compared to the first mentioned, non-tilted circular stop. Here, the diameter of the tilted, planar and circular stop 18 was optimized to 66.366 mm. Furthermore, the centre Z of the stop was displaced in this case by the value of 1.216 mm along the optical axis oA for optimizing the telecentricity. In addition to this optimization of the telecentricity, there additionally was a displacement of the centre Z by 0.270 mm perpendicular to the optical axis oA in the y-direction. Using the optimized tilt angle of α=−12.9°, $r_y/r_x=\cos(\gamma+\alpha)/\cos(\gamma)$ =1.026 emerges. This example shows that the mean deviations of the numerical aperture for the image points can be further improved by means of the tilted and circular stop 18 with the planar embodiment in view of the deviations when using an elliptical stop described in EP 1 768 172 B1. It should also be particularly highlighted that the telecentricity for the lens described in EP 1 768 172 B1 can be significantly improved by means of a tilted circular stop. The aforementioned data for the stop geometry and the numerical apertures were established over sixty-five field points distributed over the image field 8.

As explained in the context of FIG. 4, the numerical aperture of the individual image points in the image field 8 can be optimized by tilting the planar aperture stop 18 about an axis perpendicular to the object displacement direction and perpendicular to the optical axis oA. Here, the numerical aperture NA for an image point in general is a function of the azimuth angle at the relevant image point in the image plane, which is why (as shown above) NA(azimuth)=n*sin [Θ(azimuth)] applies for an image point. By means of the tilt angle α, about which the planar aperture stop 18 is tilted relative to the paraxial pupil plane, it is possible to optimize the numerical aperture for predetermined, but generally arbitrary azimuth angles. The above-described optimization such that the image-side numerical apertures $NA_x$ and $NA_y$ should be as equal as possible for all image field points corresponds to an azimuth angle=0° for $NA_x$ and an azimuth angle=90° for $NA_y$. Such an optimization results in a tilt angle α. Alternatively, the numerical aperture of all image points can also e.g. be optimized to azimuth angles which respectively correspond to the maximum $NA_{azimuth,max}$ and minimum aperture $NA_{azimuth,min}$ for the respective image point such that the image-side numerical apertures $NA_{azimuth,max}$ and $NA_{azimuth,min}$ should be as equal as possible for all image points. A tilt angle $\alpha_1$ optimized thus generally differs from the tilt angle α, in which the image-side numerical apertures $NA_x$ and $NA_y$ are as equal as possible for all image points. Optimizations of the tilt angle of the planar stop are also possible such that the image-side numerical apertures $NA_{azimuth}$ should be as equal as possible for all image points, wherein this should then apply to a predetermined, fixed azimuth angle of e.g. 45°. Such an optimization of the tilt angle of a planar stop is advantageous if, for example, structures which extend under 45° in relation to the object displacement direction are imaged by the imaging optical unit.

As mentioned, it is generally possible for the centre Z or the centre point of the stop to be displaced along the z-axis, i.e. along the optical axis. Displacements perpendicular to the optical axis in the y-direction (object displacement direction) are also possible, as was described in the example above of the tilted circular stop in a projection lens according to EP 1 768 172 B1. These displacements serve for the further optimization of the imaging properties, in particular for optimizing the telecentricity. For the further optimization, displacements of the stop centre point in the x-direction (perpendicular to the object displacement direction) are also possible.

Therefore, a centre Z of the aperture stop 18 from FIG. 3 can for example be at a distance from the intersection point of the stop plane 25 with the optical axis oA, i.e. it is, in particular, at a distance from the optical axis oA.

Depicted additionally in FIG. 3 is a coma plane 28, in which the coma rays 19, 20 from spaced apart field points intersect. This coma plane 28 is likewise perpendicular to the tilt-normal plane 27, i.e. perpendicular to the yz-plane. The stop plane 25 of the aperture stop 18 is tilted by an angle $\delta_0 \neq 0$ in relation to this coma plane 28. In the shown exemplary embodiment, the coma plane 28 is approximately perpendicular to the chief ray $16_z$ of the central field point. $\delta_0=\gamma_0-\alpha_0$ applies approximately. In FIG. 3, a chief ray crossing plane 29, in which the chief rays 16 from spaced apart field points intersect, extends parallel to the coma plane 28. The stop plane 25 is also tilted by approximately the angle $\delta_0$ in relation to the chief ray crossing plane 29. The pupil plane of the projection optical unit 7 lies in the region of the planes 28, 29.

The crossing points 28a, 28b of the coma rays 19, 20 on the one hand and 29a of the chief rays 16 on the other hand are at a distance from the aperture stop 18.

The aperture stop optionally has a functional connection to a tilt drive 18a, to which the aperture stop 18 is connected for the tilt about the tilt axis 26. In particular, a step-free tilt of the aperture stop 18 is possible by way of the tilt drive 18a. The tilt drive 18a can be connected to a sensor arrangement, not depicted in any more detail in the drawing, for measuring the image-side numerical apertures $NA_x$, $NA_y$ or $NA_{azimuth}$ (for one or more predetermined azimuth angles), wherein a tilt setpoint value can be calculated from the measurement result in a regulation unit (which is likewise not depicted here) and this setpoint value can be fed by way of an appropriate signal connection to the tilt drive 18a for regulated readjustment of a tilt actual value and hence of the value for the image-side numerical aperture, in particular $NA_y$. Thus, the yz-plane constitutes a variation plane for the image-side numerical aperture. The scanning direction y lies in this variation plane.

Imaging properties of the projection optical unit 7 with the circular aperture stop 18 arranged in the aperture plane 25 are discussed below on the basis of FIGS. 5 to 9.

Figure 5:
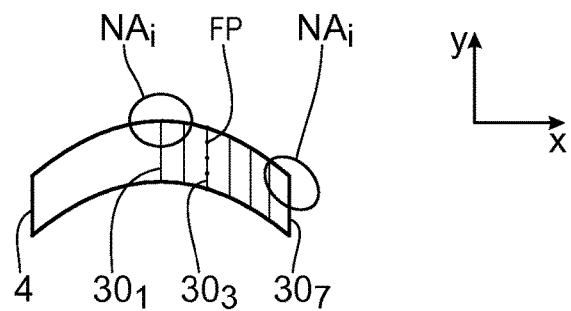
FIG. 5 shows a top view of an object field of the imaging optical unit according to FIG. 2, wherein, in an exemplary manner and by way of example, uncorrected numerical apertures of two imaging light beams which emanate from two spaced apart field points are indicated.

FIG. 5 schematically elucidates a procedure of a numerical evaluation of an imaging parameterization used here. FIG. 5 depicts a top view of the image field 8 (from FIG. 1) of the imaging optical unit 7 for an object field 4 (from FIG. 1), which may have an arcuate embodiment, assigned to this image field. In the numerical evaluation, a total of thirty-five field points FP are considered on the image field 8. Here, field points FP are selected which are lined up in one half of the image field 8 in a manner spaced apart equidistantly along the y-direction in a total of seven field point columns $30_1$ to $30_7$. The five field points FP which are lined up along the field point column $30_3$ are schematically arranged in FIG. 5. Here, the field points FP are numbered in sequence, starting with the field point FP in the column $30_1$ with the smallest y-coordinate and finishing with the field point $FP_{35}$ in the column $30_7$ with the largest y-coordinate.

A Fourier expansion of a distribution of a numerical aperture NA for each one of the field points FP of the image field 8 is calculated for these thirty-five field points FP, taking into account the optical design data of the imaging optical unit 7. Here, a calculation over the field points FP covering half of the image field 8 is sufficient. To this end, individual rays 24 (see e.g. FIGS. 1 and 2) of the imaging light 3 are targeted onto the stop boundary of the circular aperture stop 18 (or, in general, of a stop situated in the imaging optical unit) against the projection direction, proceeding from each one of the thirty-five image field points FP. Examples of such numerical apertures $NA_i$ (with $i \in \{1, 2, 3, \ldots 35\}$) not yet optimized in respect of the tilt angle are indicated in FIG. 5 for the respective upper-most image field points FP of the field point columns $30_1$ and $30_7$. These numerical apertures $NA_i$ can be understood as a boundary of sub-beams of the imaging light 3, which just still pass through the aperture stop 18 starting from these image field points (against the actual beam direction of the imaging light 3) or these sub-beams describe the numerical aperture $NA_i$ emerging for an image point i due to the stop. For the purposes of optimizing a tilt location of the aperture stop 18, the stop boundary of the aperture stop 18 is scanned equidistantly over the circumference thereof. Then the respective direction cosines kx and ky in the associated image point in the image field 8 are determined for each one of these individual rays 24. This value is then converted into polar coordinates k and ϕ. The Fourier expansion then enables access to the deviations of the resulting numerical aperture for each one of the image field points FP from a numerical aperture constant over all illumination directions of the respective field point. FIG. 5 depicts, by way of $NA_7(\phi)$ and $NA_{35}(\phi)$, the distributions of the numerical aperture as a function of the azimuth angle ϕ for the image field points $FP_7$ and $FP_{35}$. Field points distributed over the whole image field 8 can be used for calculating NA.

In general, the Fourier expansion can be written as:

$$NA(\varphi) = NA_0 + \sum_{L=1}^{N} [a_L \cos L\varphi + b_L \sin L\varphi]$$

Here, $NA_0$ is a constant contribution, ϕ is the azimuth angle in the image field plane in relation to an image point and $a_L$, $b_L$ are expansion coefficients of the Fourier expansion.

Leading expansion terms of this Fourier expansion can be written as $NA(\phi) = NA_0 + a_1 \cos \phi + b_1 \sin \phi + a_2 \cos 2\phi + b_2 \sin 2\phi + a_3 \cos 3\phi + b_3 \sin 3\phi + \ldots$ These leading terms are:
$NA_0$: constant contribution of the numerical aperture independent of the azimuth (effective NA);
$a_1$: telecentricity in the x-direction;
$b_1$: telecentricity in the y-direction;
$\sqrt{a_2^2 + b_2^2}$: ellipticity
$\sqrt{a_3^2 + b_3^2}$: trefoil FIGS. 6 to 9 provide results of this Fourier expansion. Here, the expansion terms of the Fourier expansion are depicted up to the $3^{rd}$ order for a circular stop, which is arranged in the projection optical unit described in EP 1 768 172 B1. Here, this circular stop is tilted by an angle of −13°, as was described in conjunction with FIG. 3. The stop diameter in this case is 66.254 mm. The crossing point, e.g. of the central chief ray $16_z$ with the optical axis oA, therefore lies in the stop plane 25.

Figure 6:
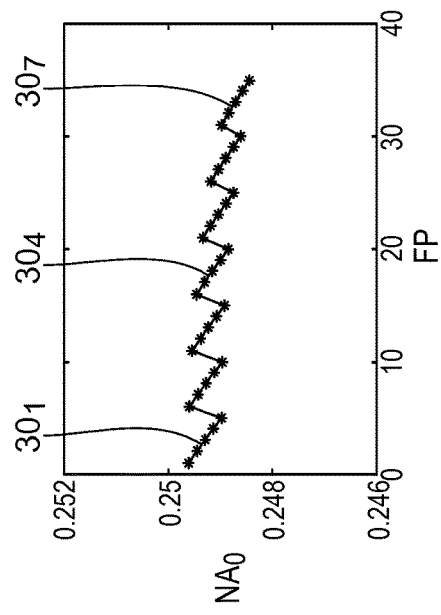
FIG. 6 shows a diagram of a zeroth order of a Fourier expansion of a numerical aperture plotted for different field points, established for selected field points of the field according to FIG. 5.

FIG. 6 shows the respective first expansion term $NA_0$ for the thirty-five field points FP. What emerges is a sawtooth-like profile, which shows that the first coefficient of the Fourier series $NA_0$ above substantially decreases from the inner image field edge to the outer image edge in the direction of the object displacement (scanning direction).

For elucidation purposes, FIG. 6 indicates an assignment of the depicted $NA_0$ curve to individual field point columns $30_1$, $30_4$ and $30_7$. The effective numerical aperture $NA_0$ only varies very little between the values of approximately 0.2484 and 0.2496 over all thirty-five field points FP. A mean value of the numerical aperture in the xz-plane, $NA_{x,average}$, emerges as 0.24954. A corresponding mean value in the yz-plane, $NA_{y,average}$, emerges as 0.24867. The difference between these two mean values, which are averaged over all thirty-five field points, is 0.00087, i.e. it is less than 0.001.

Figure 7:
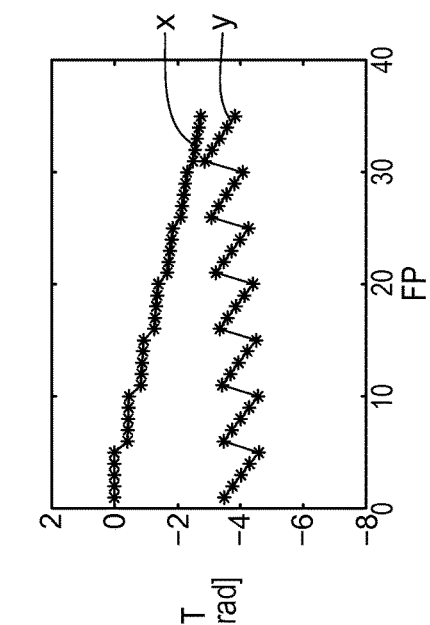
FIG. 7 shows, in an illustration similar to FIG. 6, telecentric distributions over two main directions as next order of the Fourier expansion of the numerical aperture.

FIG. 7 shows the variation of the x-telecentricity and y-telecentricity telecentricity values for the field points $FP_1$ to $FP_{35}$. For the x-telecentricity telecentricity value, slightly decreasing values to a value of approximately −2 mrad emerge over these thirty-five field points, starting from a value of 0. The y-telecentricity telecentricity values vary between values of −2 mrad and −5 mrad. The y-telecentricity telecentricity values once again vary in a stepped manner, comparable with the variation of the effective numerical aperture $NA_0$ according to FIG. 6. Here, the telecentricity specifies the angle of the centroid ray of the light beam, which extends through one of the image points $FP_1$ to $FP_{35}$, wherein the aforementioned circular stop, tilted by −13°, is arranged in the projection optical unit described in EP 1 768 172 B1 when imaging the image points. Here, the x-telecentricity is the direction cosine in the xz-plane and the y-telecentricity is the direction cosine in the yz-plane, wherein x, y and z in this case relate to a local coordinate system, the origin of which is at the considered image point, where z extends parallel to the optical axis, y extends parallel to the object displacement direction (scanning direction) and x extends perpendicular to the y-axis and z-axis. If x-telecentricity and y-telecentricity are zero for an image point, the centroid ray of the associated light beam associated with this image point is perpendicular to the image field plane 8. If the x-telecentricity is zero, the corresponding centroid ray extends in the yz-plane. Analogously, the centroid ray extends along the xz-plane when the y-telecentricity is zero.

Figure 8:
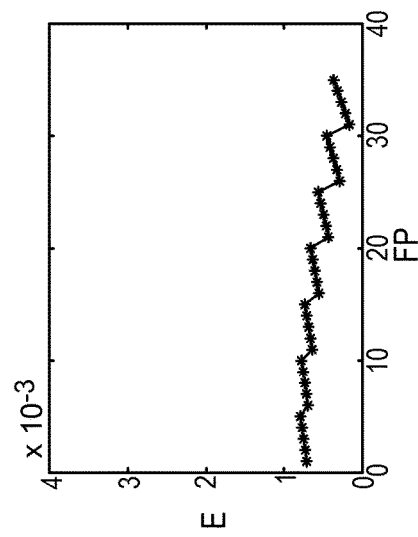
FIG. 8 shows, in an illustration similar to FIGS. 6 and 7, an ellipticity as next order of the Fourier expansion of the distribution of the numerical aperture.
Figure 10:
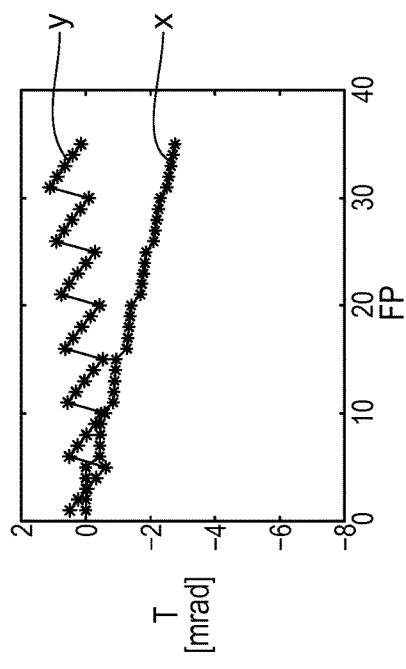
FIGS. 10 to 13 show, in illustrations similar to FIGS. 6 to 9, the numerical aperture, telecentricity, ellipticity and trefoil imaging parameters for an arrangement modified in comparison with the stop arrangement according to FIGS. 2 and 3, in which the tilted circular stop is displaced both in a y-direction perpendicular to an optical axis and in a z-direction parallel to an optical axis for optimizing imaging parameters.
Figure 12:
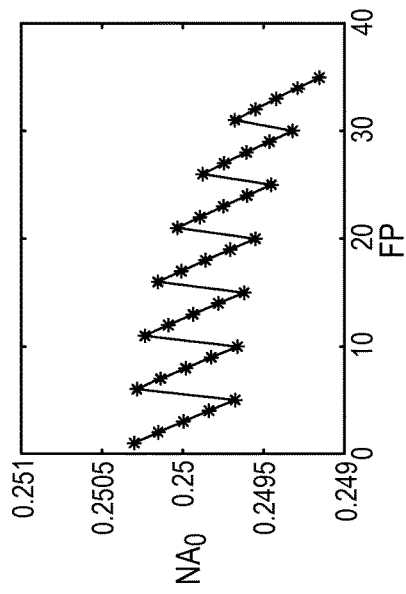

FIG. 8 shows the value of the ellipticity for the thirty-five image field points FP.

The ellipticity describes the deviation of the aperture angle of a respective beam forming the respective image point by way of the inserted stop, e.g. the tilted circular stop, from the value $NA_0$ in the direction of the main axes of the ellipse centred at the respective image point in an elliptic approximation. Here, FIG. 8 elucidates the variation of the numerical aperture along these ellipse coordinates and therefore differs from the numerical apertures in the x-direction and y-direction $NA_x$, $NA_y$ for the corresponding image point, which is why, also, the corresponding mean values of these numerical apertures differ over the considered number of image points. Thus, in FIG. 8, the mean value over the depicted 35 field points is approximately $0.5*10^{-3}$. Averaging the numerical aperture $NA_x$ over the 35 image point yields $NA_x=0.24952$ and approximately $NA_y=0.24867$, from which a difference of $0.87*10^{-3}$ emerges. In practical terms, that type of averaging for optimizing the stop will be preferred which is best fitted to the structures to be imaged. By way of example, if horizontal and/or vertical structures are imaged, i.e. structures which are oriented in the direction of the x-axis and/or y-axis, an optimization of the aperture in view of $NA_y$ and/or $NA_x$ is to be preferred. If structures that are arranged at an angle not equal to 0° or 90° in relation to the x-axis and y-axis are imaged, an optimization according to FIG. 8 is to be preferred.

Figure 9:
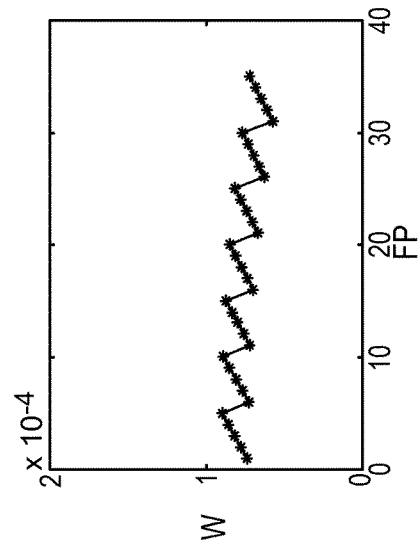
FIG. 9 shows, in an illustration similar to FIGS. 6 to 8, a trefoil as next order of the Fourier expansion of the numerical aperture.

FIG. 9 shows the variation of a further expansion term of the Fourier expansion of the numerical aperture, the so-called trefoil. This value varies between 0 and $1\times10^{-4}$. The values for the ellipticity and the trefoil also vary in a stepped manner as a function of the evaluated field points $FP_i$. Unlike the step-shaped variation of the effective numerical aperture $NA_0$ according to FIG. 6 and of the y-telecentricity telecentricity value according to FIG. 7, the values within a respective field point column do not decrease, but slightly increase instead.

Figure 11:
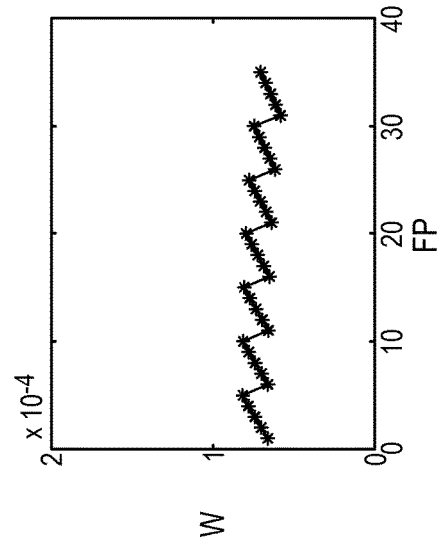
Figure 13:
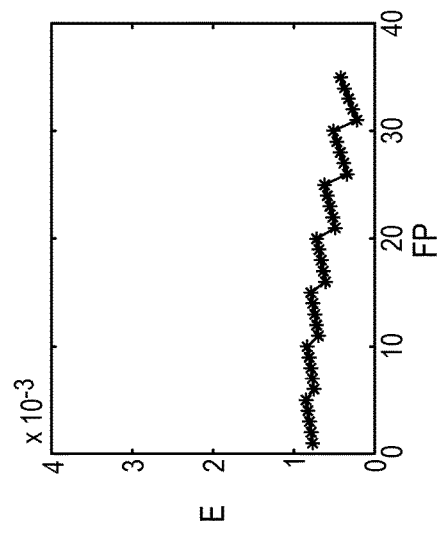

FIGS. 10 to 13 depict the expansion terms of the aforementioned Fourier expansion for a further exemplary embodiment of the tilted circular stop 18, wherein the latter is displaced along the y-direction and along the z-direction, i.e. along the optical axis oA, in terms of the stop centre point Z thereof. The displacement in the y-direction or object displacement direction relative to the optical axis is 0.270 mm in this case, the displacement along the optical axis is 1.216 mm. The tilt angle is −12.95° and the post-optimized diameter is 66.366 mm. As a result of the shift in the y-direction, it is possible to see a significant improvement in the y-telecentricity (FIG. 11). Furthermore, an improvement in the x-telecentricity is achieved by a displacement along the optical axis (FIG. 11).

In one exemplary embodiment of the tilted circular stop 18, the latter is only displaced along the y-direction but not along the z-direction in terms of the stop centre point Z thereof. The displacement in the y-direction or object displacement direction relative to the optical axis is 0.551 mm in this case. This y-displacement can lie in the range between 0.1 mm and 1.0 mm and, for example, can also be 0.2 mm, 0.25 mm, 0.27 mm or 0.3 mm. As mentioned above, no displacement was carried out along the optical axis. The tilt angle corresponds to that which was explained above in conjunction with FIGS. 10 to 13. A post-optimized stop diameter of the tilted and y-decentred circular stop 18 can correspond to that which was explained above in conjunction with FIGS. 10 to 13. Alternatively, the post-optimized diameter of the circular, y-decentred stop 18 can also have a different value, e.g. the value of 66.456 mm. What is found compared to the expansion terms described above in conjunction with FIGS. 6 to 9 is that the use of the "displacement in the y-direction" degree of freedom leads to a significant improvement in the y-telecentricity, the absolute magnitude of which at most reaches the value of 1.1 mrad over all measured field points. The additional use of the "displacement in the z-direction" degree of freedom described above in conjunction with FIGS. 10 to 13 then still leads to an improvement in the x-telecentricity. In absolute terms, a displacement in the z-direction is specified, proceeding from a location of a stop arrangement plane at the original design data, as mentioned in the respectively cited publications.

Below, a further embodiment of an imaging optical unit 31 with the tilted, circular aperture stop 32, which can be used in the projection exposure apparatus 1 instead of the projection optical unit 7, is explained on the basis of FIGS. 14 to 19. Components and functions corresponding to those that were already explained above with reference to FIGS. 1 to 13 are provided with the same reference signs and are not discussed in detail again.

Figure 14:
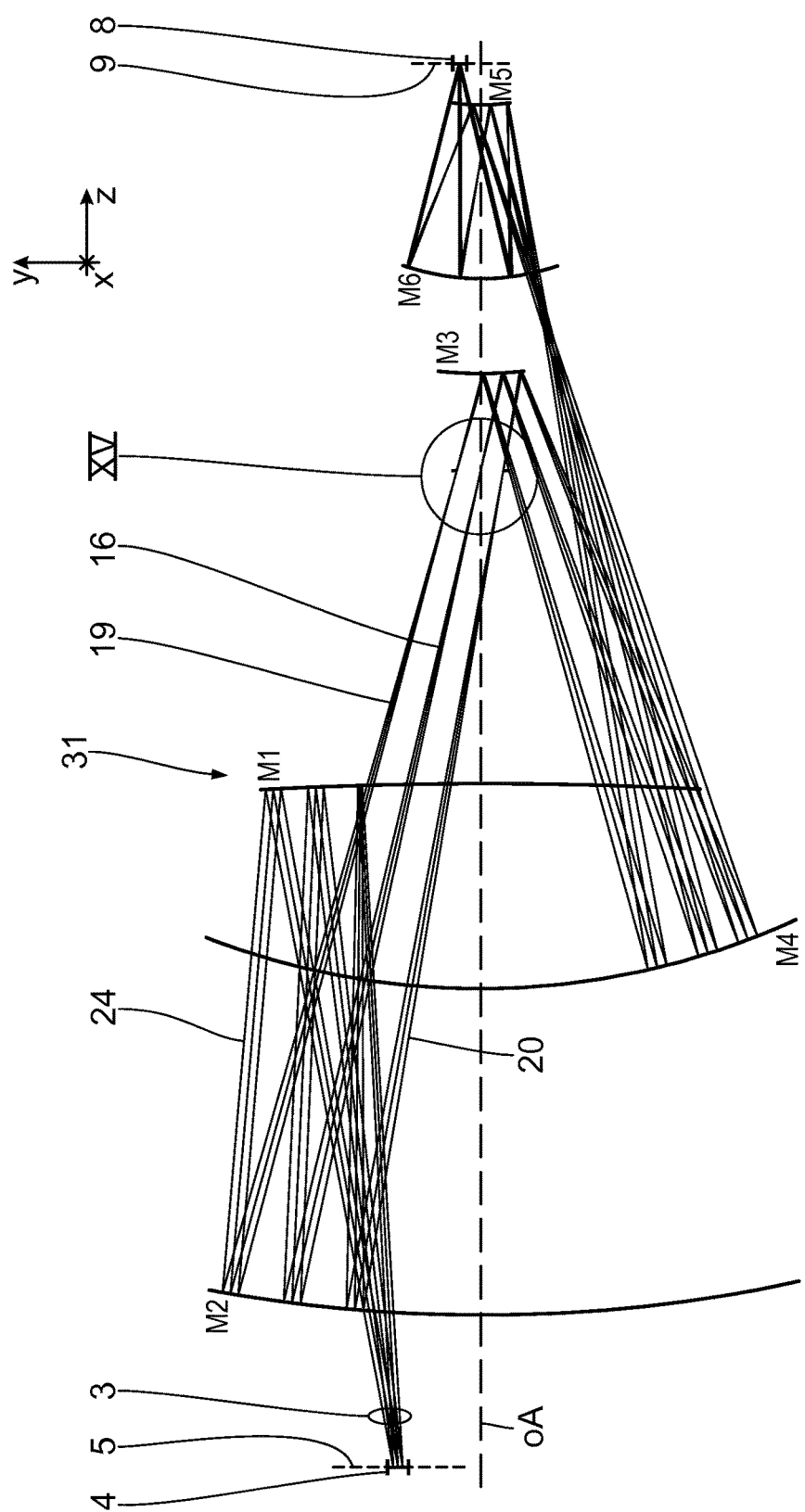
FIG. 14 shows, in an illustration similar to FIG. 2, a further embodiment of the imaging optical unit.

In the meridional section according to FIG. 14, the individual rays 24 of three field points spaced apart from one another in the y-direction are depicted in the beam path of the imaging optical unit 31, with, once again, the chief rays 16 and the coma rays 19, 20 being shown for each one of these three field points. Apart from a configuration and arrangement of the aperture stop 32, the imaging optical unit 31 corresponds to the one according to FIG. 5a of US 2007/0 223 112 A1 with the associated description.

Figure 15:
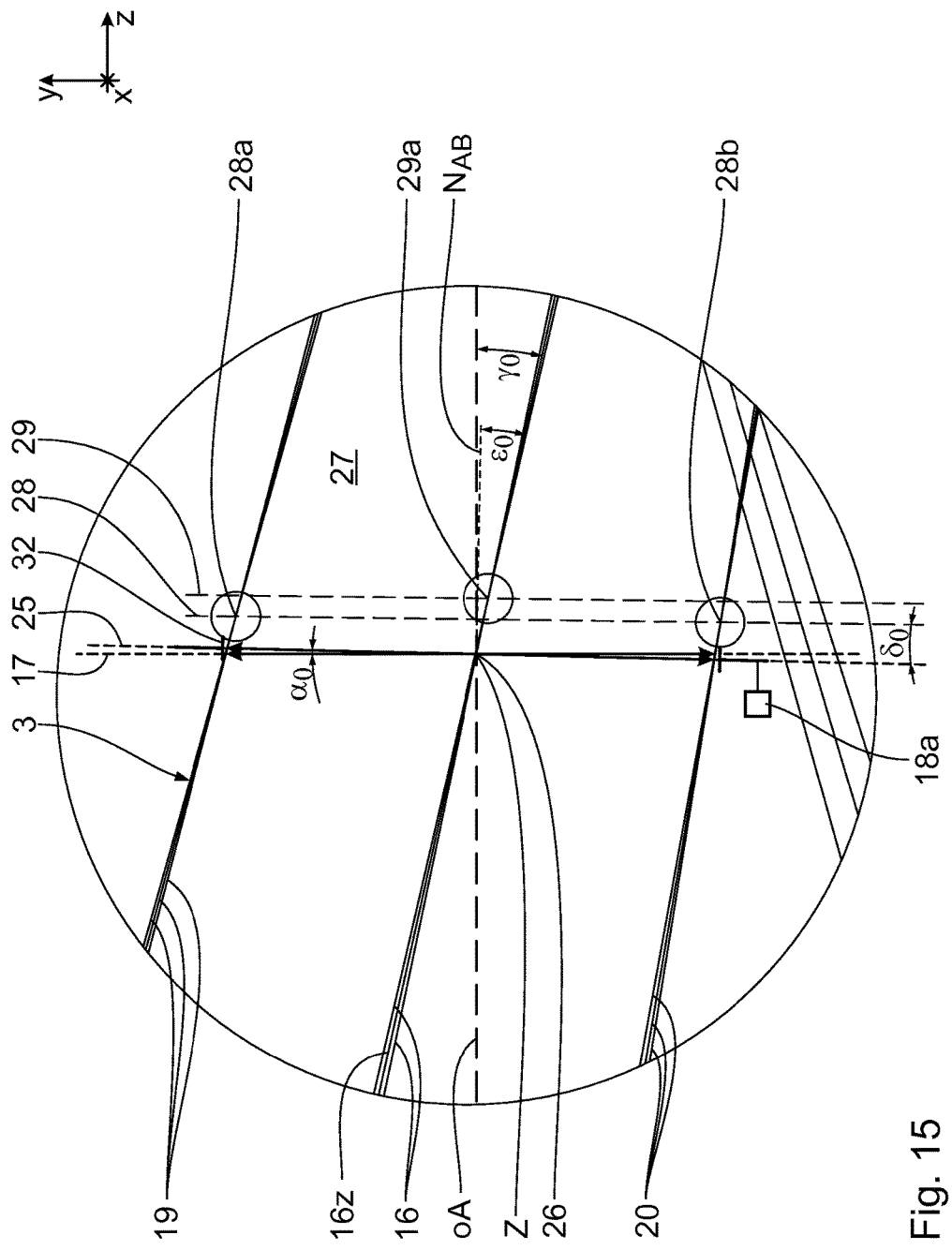
FIG. 15 shows a sectional magnification of the detail XV in FIG. 14 in the region of a tilted circular stop.

FIG. 15 shows, in a sectional magnification, the arrangement of the once again circular aperture stop 32 of the imaging optical unit 31. The aperture stop 32 has a diameter of 51.729 mm. A diameter of 51.851 mm is also possible.

The aperture stop 32 is tilted by an angle $\alpha_0$−1.3° about the tilt axis 26 in relation to the normal plane 17 on the optical axis oA. This tilt in relation to the normal plane 17 is brought about in the clockwise direction in the orientation according to FIGS. 14 and 15.

The aperture stop 32 is tilted in such a way that the angle 130 of the stop normal $N_{AB}$ in relation to the chief ray $16_z$ of the central field point is reduced compared to the angle $\gamma_0$ of the optical axis oA in relation to the chief ray $16_z$ of the central field point. $\epsilon_0=\gamma_0+\alpha_0$ applies in the aperture stop 32.

The coma plane 28 and the chief ray crossing plane 29 parallel thereto are once again plotted in FIG. 15. The stop plane 25 is tilted in relation to both planes.

Crossing points 28a, 28b of the coma rays 19, 20 on the one hand and 29a of the chief rays 16 on the other hand are distant from the aperture stop 32.

For the purposes of optimizing the y-telecentricity, a centre Z of the aperture stop 32 can be distant from the intersection point of the stop plane 25 with the optical axis oA, i.e., in particular, distant from the optical axis oA. The ideal distance in the y-direction is approximately 0.28 mm in this case for the exemplary embodiment according to FIG. 14. Furthermore, the centre of the stop can be displaced in the direction of the optical axis in relation to the chief ray plane such that there is also minimization of the x-telecentricity. A displacement value can lie in the region of 1.2 mm, but it can also, for example, be significantly larger and be e.g. 2.5 mm.

FIGS. 16 to 19 show the dependence of the leading expansion terms of the Fourier expansion of the numerical aperture for the thirty-five field points FP for the circular stop tilted by −1.3° according to the exemplary embodiment according to FIG. 14 in accordance with what was already explained above in conjunction with FIGS. 6 to 9. In FIGS. 16 to 19, a tilted, circular stop, which is displaced in the y-direction and z-direction for optimizing the telecentricity, is used in the imaging optical unit 31 according to FIG. 5a of US 2007/0 223 112 A1. Here, the displacement in the y-direction is 0.28 mm and the displacement in the z-direction is 1.21 mm. The tilt angle $\alpha = -1.3°$.

Figure 16:
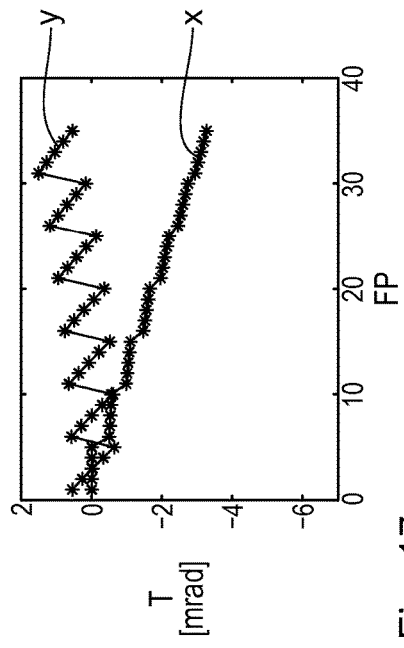
FIGS. 16 to 19 show, in illustrations similar to FIGS. 6 to 9, the corresponding imaging parameters for selected field points of the imaging optical unit according to FIG. 14.
Figure 17:
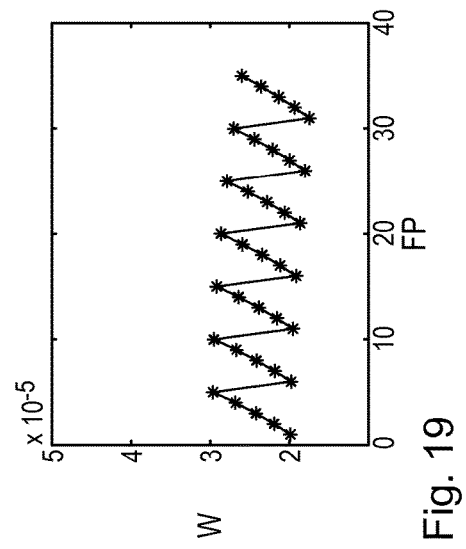
Figure 18:
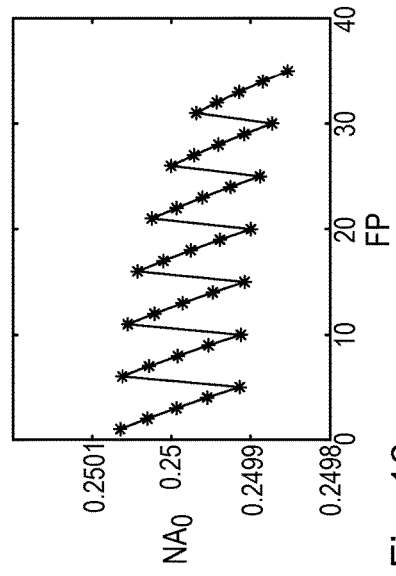
Figure 19:
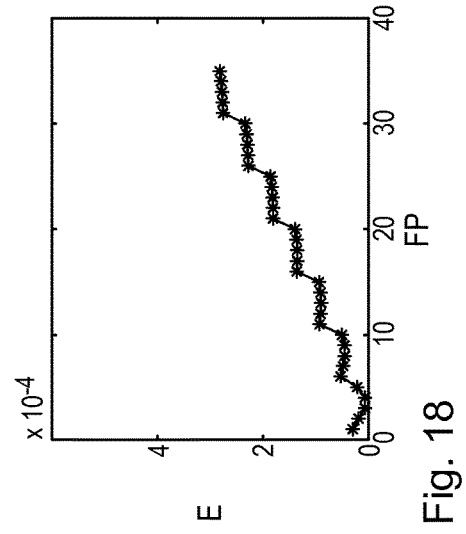

The effective numerical aperture $NA_0$ according to FIG. 16 varies between values of 0.2498 and 0.2501. Averaged over all thirty-five field points, a mean numerical aperture $NA_{x,average}$ of 0.25039 emerges in the xz-plane and a mean value $NA_{y,average}$ of 0.25060 emerges in the yz-plane. The difference of these mean values yields 0.00021.

The x-telecentricity telecentricity value varies between the values of 0 mrad and −2 mrad and decreases monotonically between the field points $FP_1$ and $FP_{35}$. The y-telecentricity telecentricity value varies between the values of 1 mrad and −1 mrad. The ellipticity value varies between the values of 0 and $3 \times 10^{-4}$. The trefoil value varies between the values of $2 \times 10^{-5}$ and $3 \times 10^{-5}$. The variations of $NA_0$, of the telecentricity value of the y-telecentricity, of the ellipticity and of the trefoil once again have sawtooth structures for the respective field point columns $30_i$.

In the exemplary embodiment depicted in FIG. 14, the ratio $r_y/r_x = 1.004$, said ratio having been described in conjunction with FIG. 4. For the ideal tilt angle of the circular aperture stop, the ratio $\cos(\gamma+\alpha)/\cos(\gamma) = 1.005$, which has good correspondence with the ratio $r_y/r_x = 1.004$.

Figure 20:
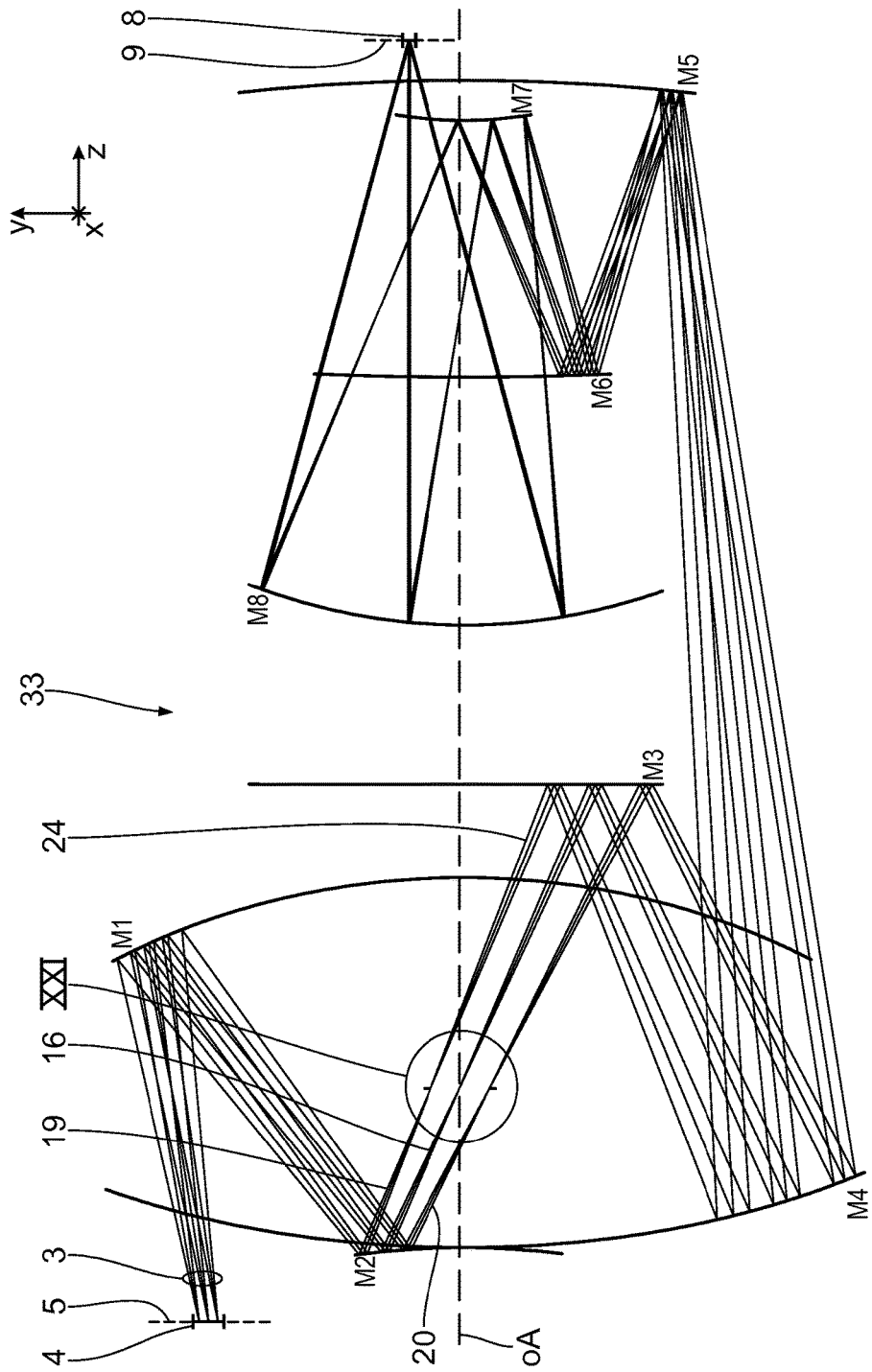
FIG. 20 shows, in an illustration similar to FIG. 2, a further embodiment of the imaging optical unit.

FIG. 20 is used below to explain a further embodiment of an imaging optical unit 33 with the tilted, circular aperture stop 34, which can be used in the projection exposure apparatus 1 instead of the projection optical unit 7. Components and functions corresponding to those that were already explained above with reference to FIGS. 1 to 19 are provided with the same reference signs and are not discussed in detail again. In this embodiment, the stop centre is displaced neither in the y-direction nor in the z-direction.

Apart from a configuration and arrangement of the aperture stop 34, the imaging optical unit 33 corresponds to the embodiment according to FIG. 1 in US 2003/0 076 483 A1, which is also published as U.S. Pat. No. 6,781,671. Compared to the meridional section in FIG. 1 of US 2003/0 076 483 A1, the projection optical unit 33 according to FIG. 20 is depicted in a manner mirrored about an axis parallel to the xy-axis.

Figure 21:
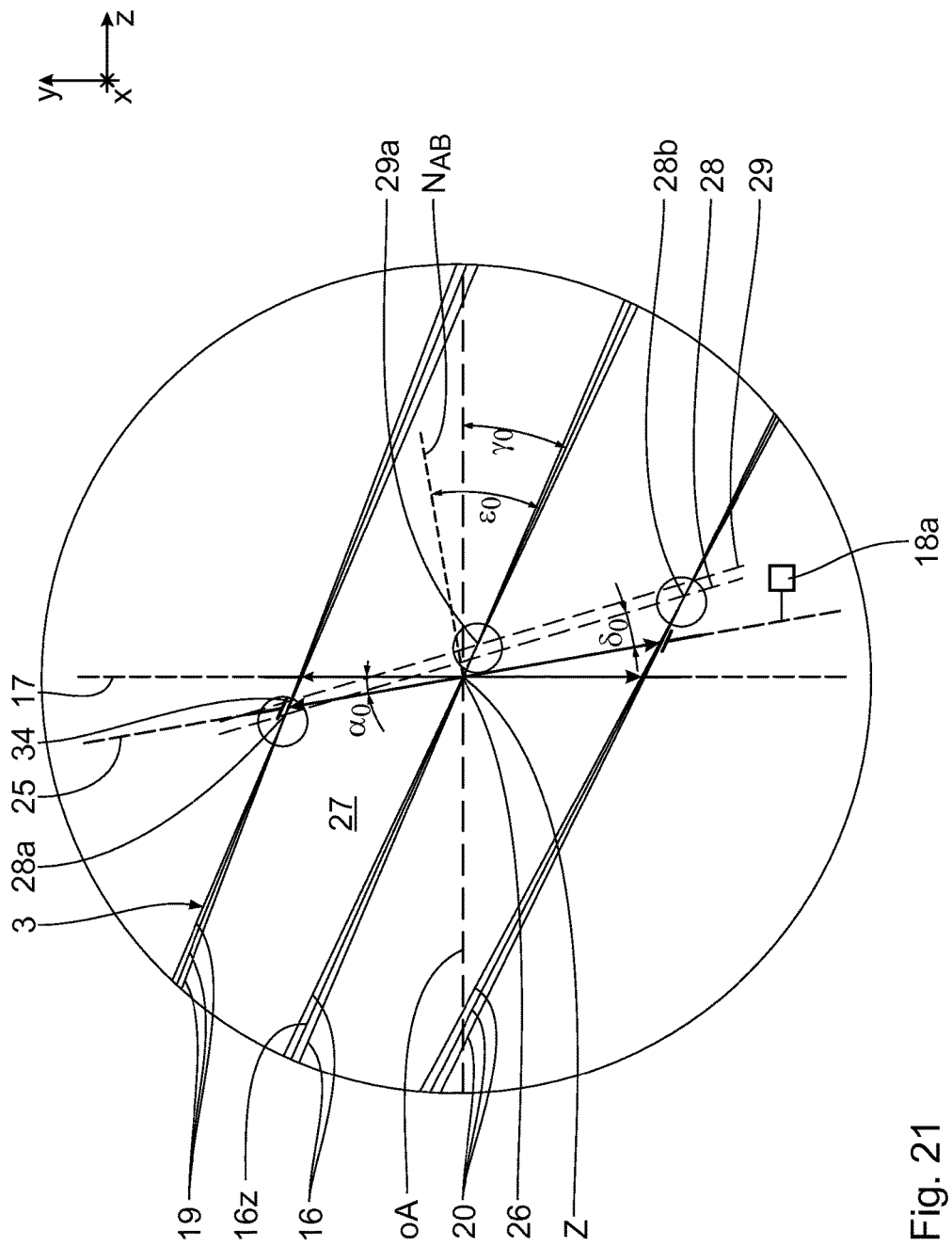
FIG. 21 shows a sectional magnification of the detail XXI in FIG. 20 in the region of a tilted circular stop.
Figure 22:
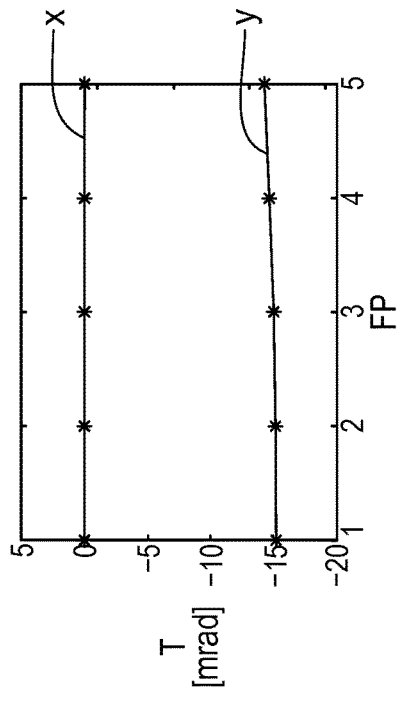
FIGS. 22 to 25 show, in illustrations similar to FIGS. 6 to 9, the corresponding imaging parameters for selected field points of the imaging optical unit according to FIG. 20.
Figure 23:
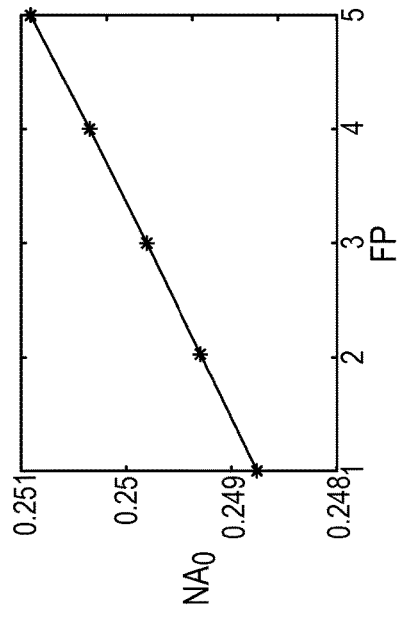
Figure 24:
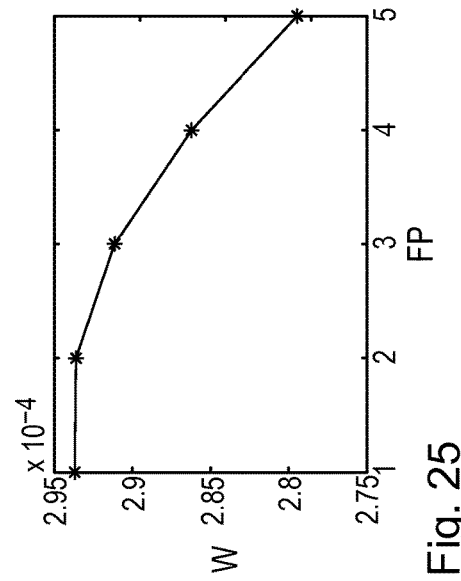
Figure 25:
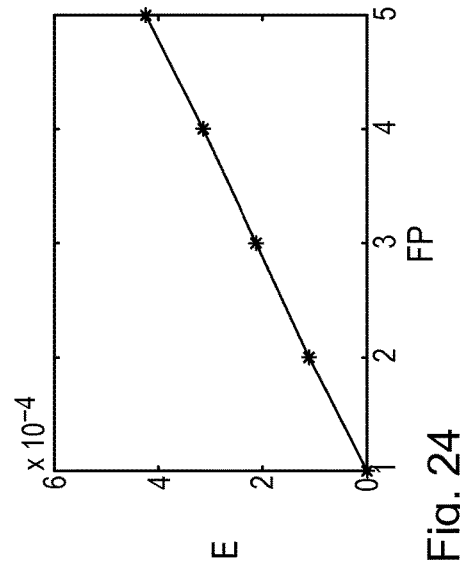
Figure 26:
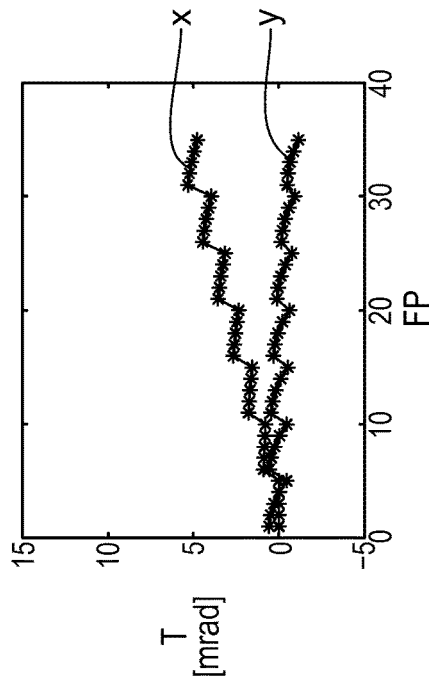
FIGS. 26 to 29 show, in illustrations similar to FIGS. 6 to 9, the corresponding imaging parameters for further selected field points of the imaging optical unit according to FIG. 20.
Figure 28:
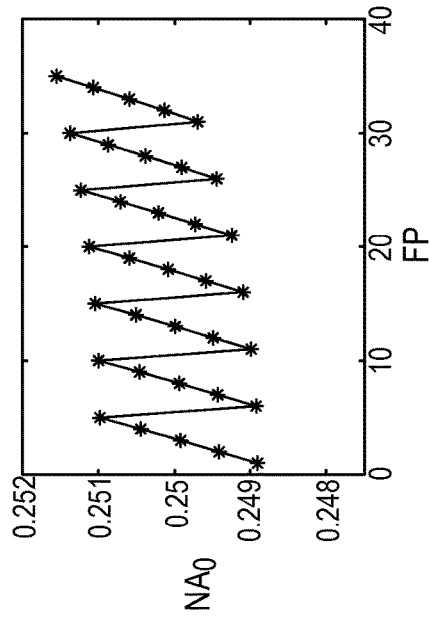
Figure 27:
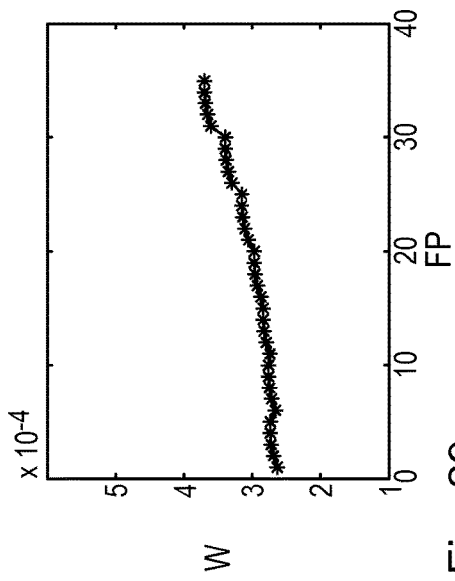
Figure 29:
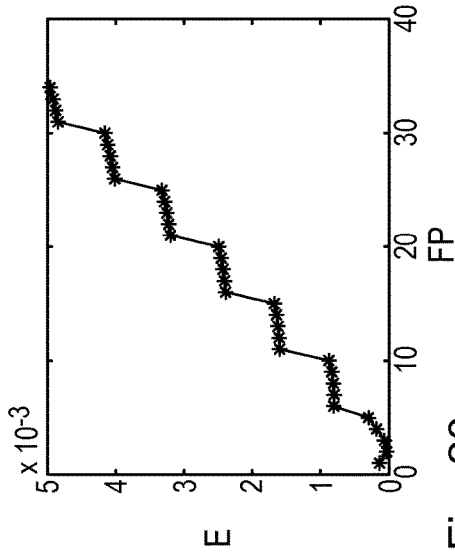
Figure 30:
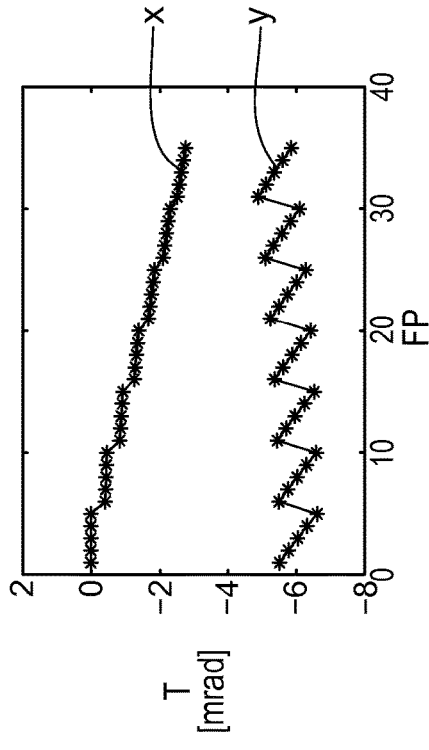
FIGS. 30 to 33 show, in illustrations similar to FIGS. 6 to 9, the corresponding imaging parameters for selected field points of the imaging optical unit according to FIG. 2, wherein use is made of a non-tilted, circular stop.
Figure 31:
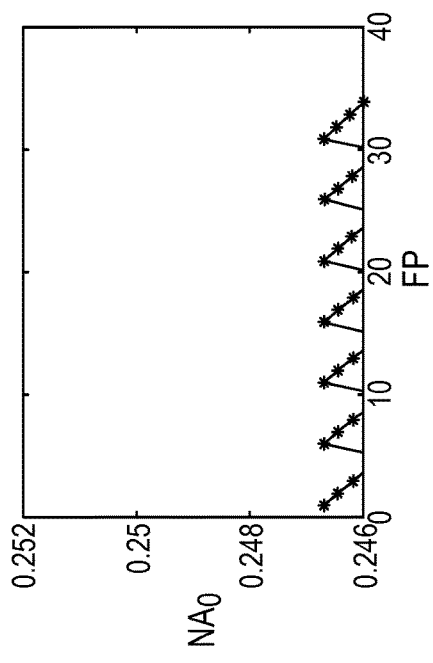
Figure 32:
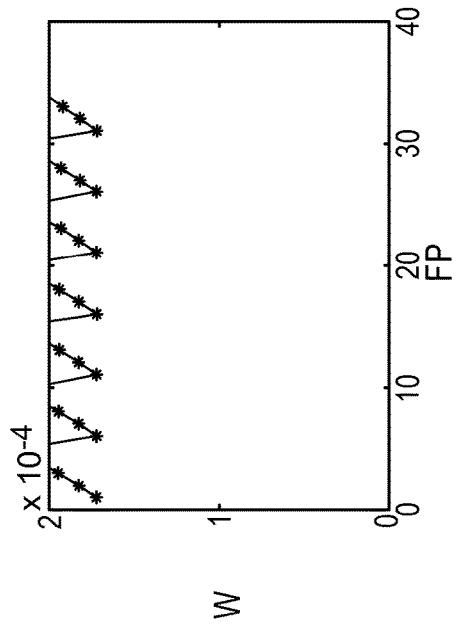
Figure 33:
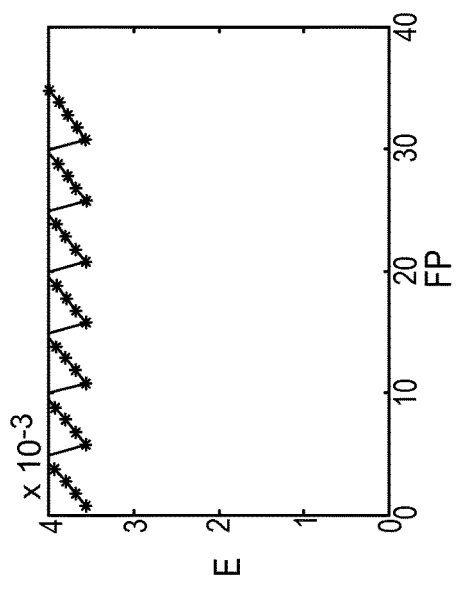
Figure 34:
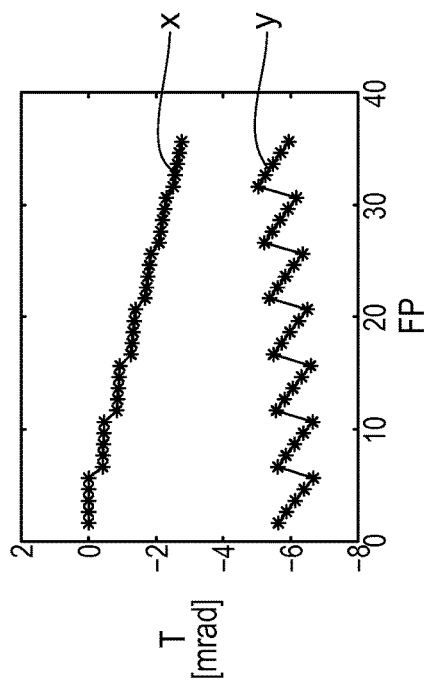
FIGS. 34 to 37 show, in illustrations similar to FIGS. 6 to 9, the corresponding imaging parameters for selected field points of the imaging optical unit according to FIG. 2, wherein use is made of an elliptical stop instead of a tilted circular stop.
Figure 36:
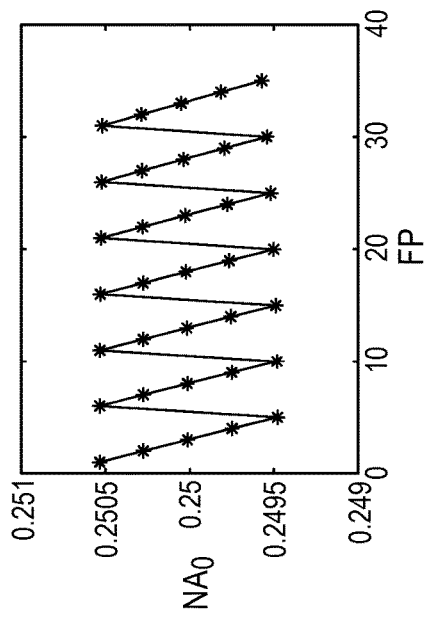
Figure 35:
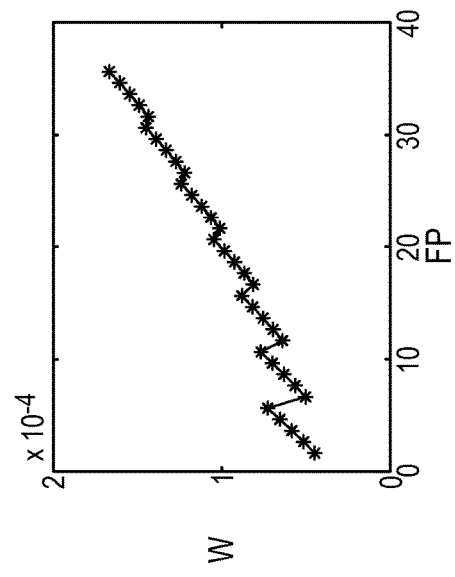
Figure 37:
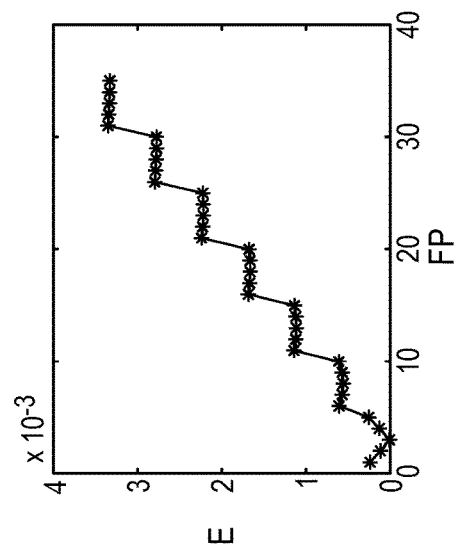
Figure 38:
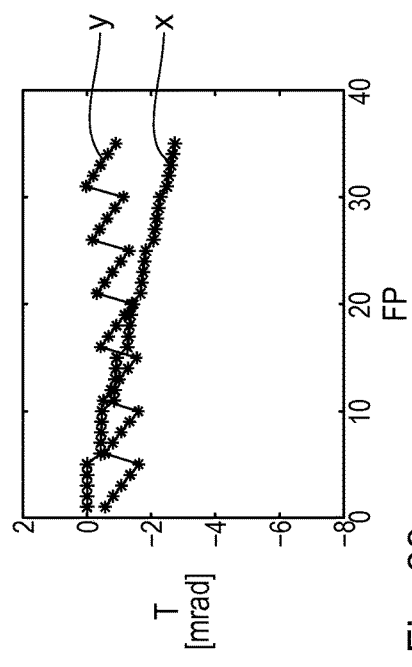
FIGS. 38 to 41 show, in illustrations similar to FIGS. 6 to 9, the corresponding imaging parameters for selected field points of the imaging optical unit according to FIG. 2, wherein use is made of an elliptical stop, instead of a tilted circular stop, wherein the elliptical stop is displaced perpendicular to the optical axis in the y-direction compared with the arrangement according to FIGS. 34 to 37.
Figure 39:
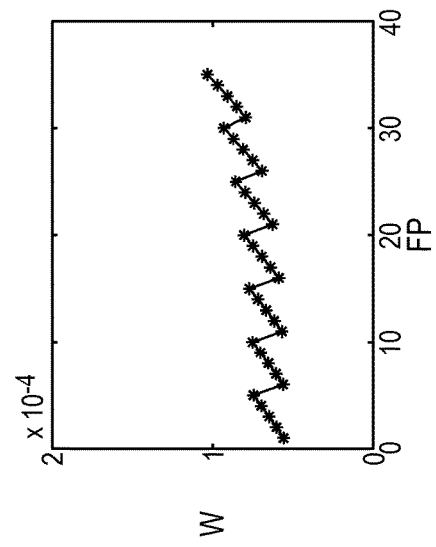
Figure 40:
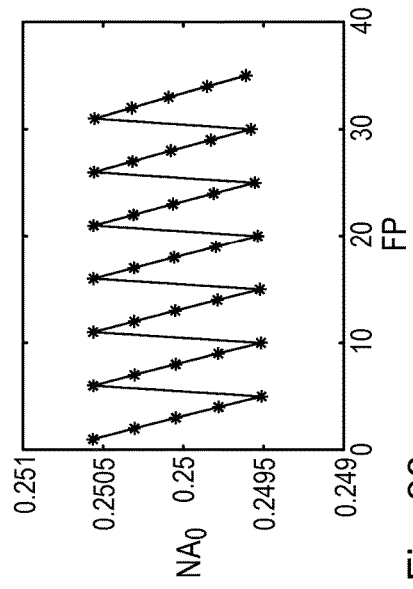
Figure 41:
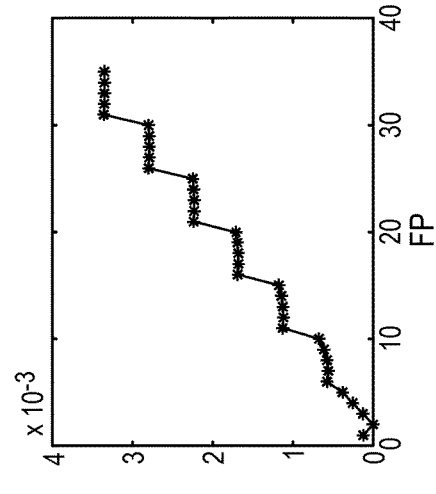
Figure 42:
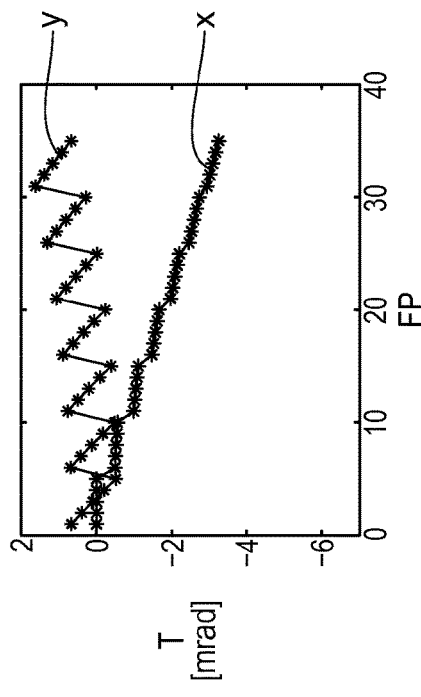
FIGS. 42 to 45 show, in illustrations similar to FIGS. 6 to 9, the imaging parameters for selected field points of the imaging optical unit according to FIG. 14, wherein use is made of an elliptical stop which is displaced perpendicular to the optical axis in the y-direction.
Figure 43:
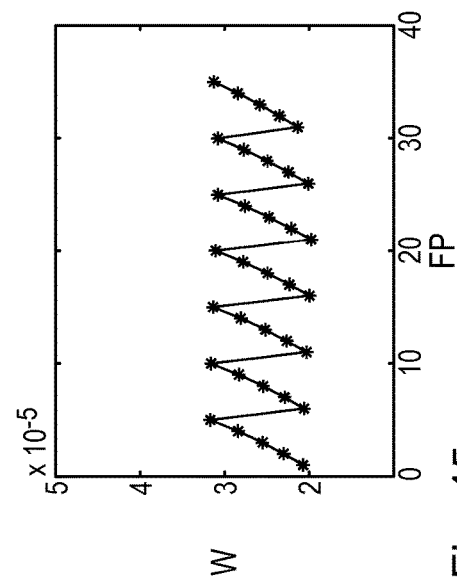
Figure 44:
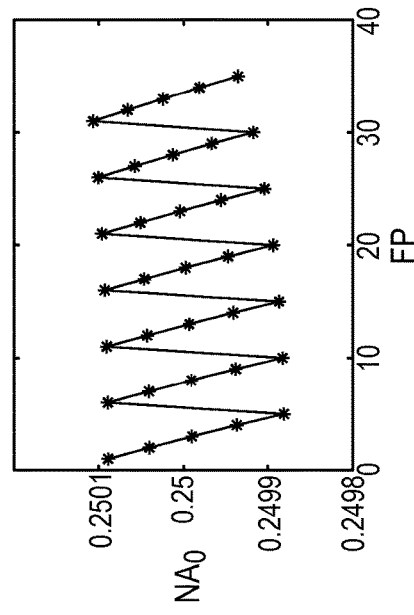
Figure 45:
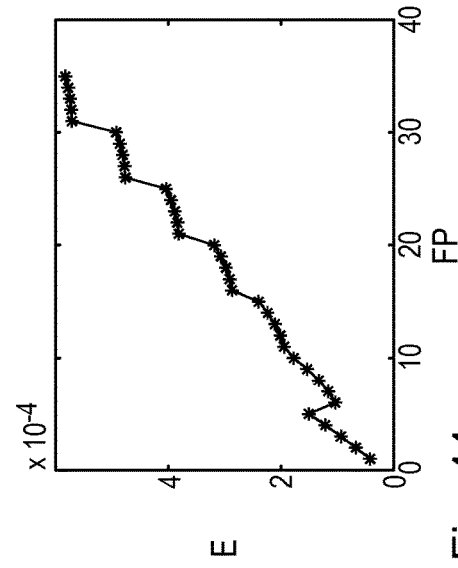
Figure 46:
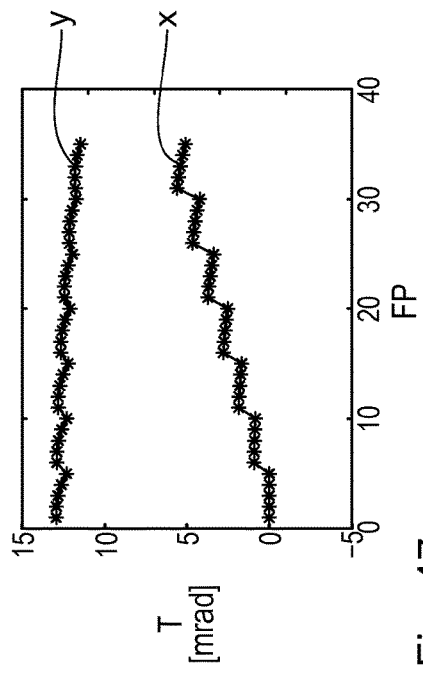
FIGS. 46 to 49 show, in illustrations similar to FIGS. 6 to 9, the imaging parameters for selected field points of the imaging optical unit according to FIG. 20, wherein use is made of an elliptical stop.
Figure 48:
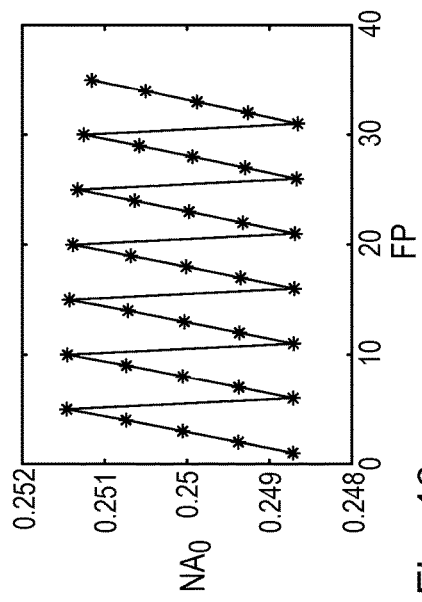
Figure 47:
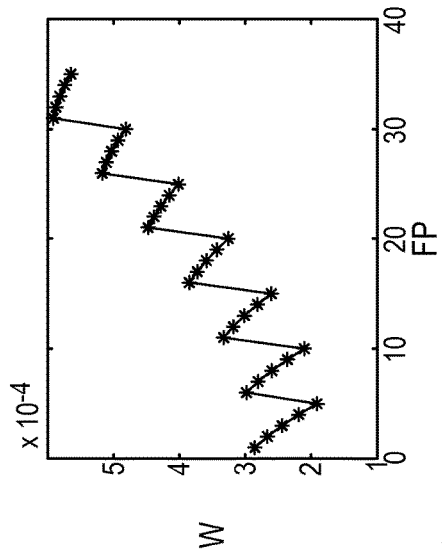
Figure 49:
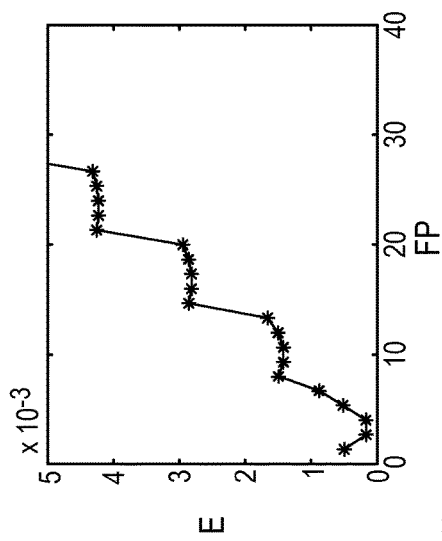
Figure 50:
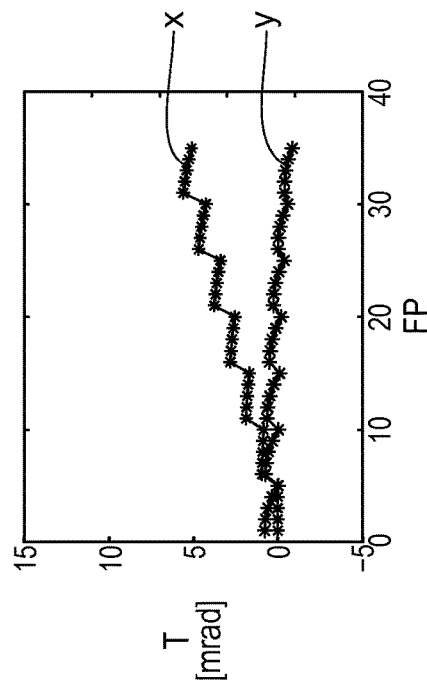
FIGS. 50 to 53 show, in illustrations similar to FIGS. 6 to 9, the imaging parameters for selected field points of the imaging optical unit according to FIG. 20, wherein use is made of an elliptical stop which is displaced perpendicular to the optical axis in the y-direction.
Figure 51:
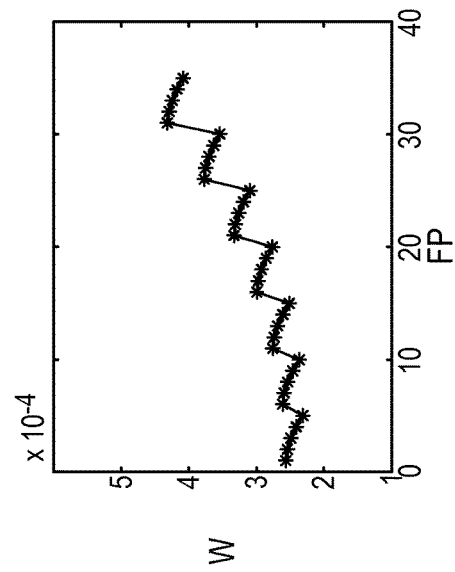
Figure 52:
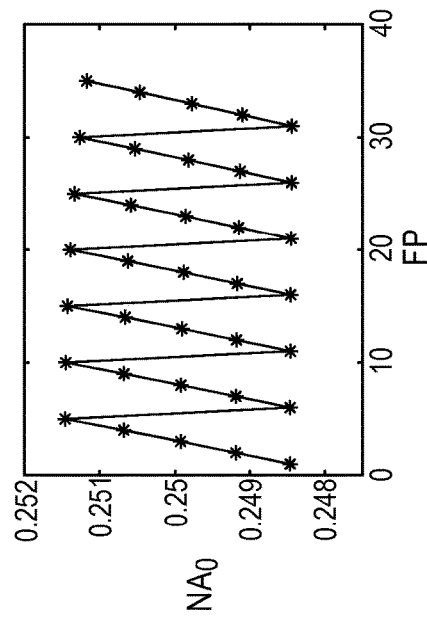
Figure 53:
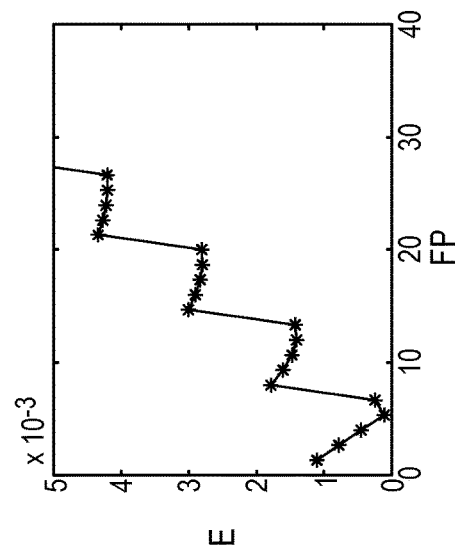

In the embodiment according to FIGS. 20 and 21, the aperture stop 34 is also circular and has a diameter of 31.032 mm. A diameter of 31.059 mm is also possible.

The aperture stop 34 is tilted in relation to the normal plane 17 by a tilt angle $\alpha_0$ of +8.6°. This tilt is once again implemented in the anticlockwise direction about the tilt axis 26 in the illustration according to FIG. 21. This tilt is such that the angle $\beta_0$ of the stop normal $N_{AB}$ in relation to the chief ray $16_z$ of the central field point is increased compared to the angle $\gamma_0$ of the optical axis oA in relation to the chief ray $16_z$ of the central field point. That is to say, $\epsilon_0 = \gamma_0 + \alpha_0$ applies again.

In the exemplary embodiment depicted in FIG. 20, the ratio $r_y/r_x = 0.920$, said ratio having been described in conjunction with FIG. 4. For the ideal tilt angle of the circular aperture stop, the ratio $\cos(\gamma+\alpha)/\cos(\gamma) = 0.929$, which has good correspondence with the ratio $r_y/r_x = 0.920$.

FIG. 21 once again depicts the coma plane 28 and the chief ray crossing plane 29. The stop plane 25 is respectively tilted by the angle $\delta_0$ in relation to these planes.

The crossing point 28a of the coma rays 19 lies in the region of the stop plane 25 and in the region of an inner boundary of the aperture stop 34. The crossing point 28b of the coma rays 20 and the crossing point 29a of the chief rays 16 are distant from the aperture stop 34.

A centre Z of the aperture stop 34 is distant from the intersection point between the stop plane 25 and the optical axis oA.

FIGS. 22 to 25 in turn show numerical results in the Fourier expansion of the numerical aperture when using the aperture stop 34 according to FIGS. 20 and 21. Depicted here are the results of five field points, which respectively lie in the centre of one of the field point columns $30_i$, which were already explained above in conjunction with the explanations according to FIGS. 2 to 19.

The first term of the Fourier expansion, i.e. the effective numerical aperture $NA_0$, varies between values of 0.248 and 0.251 when using the aperture stop 34. Averaged over the field points, a value $NA_{x,average}$ of 0.25137 emerges in the xz-plane and a value $NA_{y,average}$ of 0.24924 emerges in the yz-plane. A difference between these two mean values is 0.00213.

An x-telecentricity telecentricity value lies very close to the value of 0 mrad when using the aperture stop 34. A y-telecentricity telecentricity value lies in the region between −15 and −14 mrad. An ellipticity value lies in the range between 0 and $5 \times 10^{-4}$. A trefoil value lies in the range between 2.75 and $2.95 \times 10^{-4}$.

In FIGS. 26 to 29, a tilted, circular stop which is displaced in the y-direction and z-direction for optimizing the telecentricity is used in the imaging optical unit 33 according to FIG. 1 of US 2003/0 076 483 A1. Here, the shift is −0.410 mm in the y-direction and −0.916 mm in the z-direction. The tilt angle $\alpha = +8.09°$ and the stop diameter was optimized to 30.946 mm. The tilt axis is arranged analogously to FIG. 21. A comparison between FIGS. 26 to 29 and 22 to 25 shows that the ellipticity and the telecentricity are slightly better in the case of the tilted and displaced circular stop than in the case of the non-displaced tilted circular stop.

The first term of the Fourier expansion, i.e. the effective numerical aperture $NA_0$, varies between values of 0.249 and 0.252 when using an appropriately displaced and decentred stop 34. Averaged over all field points, a value $NA_{x,average}$ of 0.24984 emerges in the xz-plane and a value $NA_{y,average}$ of 0.24989 emerges in the yz-plane. A difference between these two mean values is 0.00095.

Accordingly, an optimization of the tilted, circular aperture stop 34, in which the latter is only decentred in the y-direction but not displaced in the z-direction, is also possible. Here, the y-decentering can have the value of −0.839 mm.

In order to compare the expansion terms of the Fourier expansion above in the case of the tilted circular stop from FIG. 6 to FIG. 9 with a non-tilted circular stop, FIGS. 30 to 33 depict the corresponding expansion terms of a circular stop with a diameter of 66.254 mm, with the stop being arranged centrally in relation to the optical axis in the chief ray plane. It is possible to see a significant reduction of $NA_0$ of approximately 0.002 in the case of the non-tilted stop. Furthermore, the system with the non-tilted, circular stop has a y-telecentricity that is approximately 50% worse (see FIG. 31) than a system with a circular stop that is tilted by approximately −13° (see FIG. 7). A comparison of FIG. 32 and FIG. 8 yields that the ellipticity is likewise worse by approximately a factor of 4. A similar result applies to the trefoils depicted in FIGS. 9 and 33. Compared to an elliptical stop arranged centred in relation to the optical axis, which will still be described below in conjunction with FIGS. 34 to 37, it was also found that the non-tilted, circular stop has worse Fourier coefficients. A correction effect of the tilt degree of freedom for the stop is a correction of the ellipticity, as emerges, for example from the data comparison above.

FIGS. 34 to 37 depict the expansion terms of the Fourier expansion up to the third order for an elliptical stop, as is arranged and used in the projection optical unit described in EP 1 768 172 B1. Here, the stop has a semi-major axis of 68.348 mm in the object displacement direction (y-direction). Furthermore, the stop is perpendicular to the optical axis. The semi-minor axis of the stop is 66.254 mm in a direction (x-direction) perpendicular to the object displacement direction (y-direction). A comparison with FIGS. 6 to 9 shows that the telecentricity, in particular the y-telecentricity, has significantly smaller values in the case of the circular stop tilted by −13° than in the case of the elliptic stop arranged perpendicular to the optical axis in the paraxial pupil plane. Furthermore, the ellipticity is significantly reduced in the case of the tilted, circular stop, and so for example, a mean value of $0.5*10^{-3}$ emerges in the case of the tilted stop, whereas the ellipticity in the case of the non-tilted elliptic stop is approximately $2*10^{-3}$ and therefore worse by approximately a factor of 4 than in the case of the tilted stop. There likewise is an improvement in the trefoil in the case of the tilted circular stop.

FIGS. 38 to 41 likewise again depict the expansion terms of the Fourier expansion up to the third order for an elliptical stop, as used in the projection optical unit described in EP 1 768 172 with the dimensions specified above, wherein, however, the stop is displaced by approximately 0.7 mm in the object displacement direction (scanning direction). Hence, the centre of the elliptical stop is spaced from the optical axis in the y-direction by 0.7 mm. As emerges from the comparison of the respective FIGS. 34 to 37 and 38 to 41, a significant improvement in the y-telecentricity and in the trefoil can be achieved by small displacements of the stop centre in the direction of the object displacement direction by approximately 1.5 mm, by 0.7 mm in the shown example, wherein the expansion coefficients for the zeroth and second order remain substantially unchanged in such a stop. Furthermore, the x-telecentricity can be improved by an optionally additionally implemented displacement of the stop centre point along the optical axis, i.e. in the z-direction.

The following mean values for the numerical apertures $NA_x$ and $NA_y$ in the x-direction and y-direction emerge for four of the six shown embodiments of the imaging optical unit 3 according to FIG. 3 from EP 1 768 172 B1, which are summarized in Table 1, with the graphical display of the Fourier coefficients for the non-tilted, circular stop arranged in the paraxial pupil plane being dispensed with.

TABLE 1

Comparison of NA characteristic values for various stop configurations in an imaging optical unit as per FIG. 3 of EP 1 768 172 B1

| Table 1 | $NA_{x\_average}$ | $NA_{y\_average}$ | Difference |
|---|---|---|---|
| Tilted, circular, non-displaced stop | 0.24954 | 0.24867 | 0.00087 |
| Tilted, circular, displaced stop | 0.24984 | 0.24889 | 0.00095 |
| Elliptical and displaced stop | 0.24952 | 0.25058 | 0.00106 |
| Non-tilted, circular stop | 0.24952 | 0.24297 | 0.00655 |

Table 1 shows that better results in respect of the variation of the numerical aperture of the image field can be obtained with tilted, circular aperture stops than with stops arranged in the paraxial pupil plane. Furthermore, the telecentricity can be significantly improved.

In FIGS. 42 to 45, an elliptic stop arranged in the paraxial pupil plane, i.e. arranged perpendicular to the optical axis in the chief ray plane, is used in the imaging optical unit 31 according to FIG. 5a of US 2007/0 223 112 A1. Here, the centre point of this stop is displaced from the optical axis by 0.6 mm in the y-direction in order to adapt the y-telecentricity. The stop has an extent of 51.840 mm in the x-direction and 52.052 mm in the y-direction. In the case of such a non-tilted elliptic stop, the y-telecentricity can be improved by y-decentering.

A comparison between FIGS. 42 to 45 and FIGS. 16 to 19 shows that the ellipticity and the telecentricity is slightly better in the case of the tilted and displaced circular stop than in the case of the displaced elliptic stop.

The following mean values for the numerical apertures $NA_x$ and $NA_y$ in the x-direction and y-direction emerge for the various embodiments of the imaging optical unit 31 according to FIG. 5a from US 2007/0 223 112 A1, which are summarized in Table 2, with the graphical display of the Fourier coefficients for the non-tilted, circular stop arranged in the paraxial pupil plane being dispensed with.

TABLE 2

Comparison of NA characteristic values for various stop configurations in an imaging optical unit as per FIG. 5a from US 2007/0 223 112 A1

| Table 2 | $NA_{x\_average}$ | $NA_{y\_average}$ | Difference |
|---|---|---|---|
| Tilted, circular, non-displaced stop | 0.24988 | 0.25008 | 0.00020 |
| Tilted, circular, displaced stop | 0.25039 | 0.25060 | 0.00021 |
| Elliptical and displaced stop | 0.24988 | 0.25013 | 0.00025 |
| Non-tilted, circular stop | 0.24988 | 0.24912 | 0.00076 |

Table 2 shows that better results in respect of the variation of the numerical aperture of the image field can be obtained with tilted, circular aperture stops than with stops arranged in the paraxial pupil plane.

In FIGS. 46 to 49, an elliptic stop which is not displaced in the y-direction and z-direction is used in the imaging optical unit 33 according to FIG. 1 of US 2003/0 076 483 A1. The aperture stop is arranged in the paraxial pupil plane, i.e. perpendicular to the optical axis in the chief ray plane. The stop has an extent of 31.032 mm in the x-direction and 28.548 mm in the y-direction.

In FIGS. 50 to 53, a displaced elliptic stop which is displaced in the y-direction and z-direction for optimizing the telecentricity is used in the imaging optical unit 33 according to FIG. 1 of US 2003/0 076 483 A1. The aperture stop is arranged in the paraxial pupil plane, i.e. perpendicular to the optical axis in the chief ray plane. Here, the centre point of this stop is displaced from the optical axis by −0.7 mm in the y-direction in order to adapt the y-telecentricity. The stop has an extent of 31.032 mm in the x-direction and 28.548 mm in the y-direction.

The following mean values for the numerical apertures $NA_x$ and $NA_y$ in the x-direction and y-direction emerge for three of the four shown embodiments of the imaging optical unit 33 according to FIG. 1 from US 2003/0 076 483 A1, which are summarized in Table 3. Furthermore, the mean values for a non-tilted, circular stop in the paraxial pupil plane are specified, with the graphical display of the Fourier coefficients for the non-tilted, circular stop being dispensed with.

TABLE 3

Comparison of NA characteristic values for various stop configurations in an imaging optical unit as per FIG. 1 from US 2003/0 076 483 A1

| Table 3 | $NA_{x\_average}$ | $NA_{y\_average}$ | Difference |
| --- | --- | --- | --- |
| Tilted, circular, non-displaced stop | 0.25137 | 0.24924 | 0.00213 |
| Tilted, circular, displaced stop | 0.25182 | 0.24997 | 0.00185 |
| Elliptical displaced stop | 0.25136 | 0.24871 | 0.00265 |
| Non-tilted circular stop | 0.25138 | 0.27052 | 0.01913 |

Table 3 likewise shows that tilted, circular aperture stops can achieve better results in respect of the variation of the numerical aperture of the image field than stops arranged in the paraxial pupil plane.

As the various exemplary embodiments of aperture stops in the three projection lenses for EUV lithography depicted above show, it is possible to achieve a homogenization of the numerical aperture of the image field of the lens using a tilted, circular stop, which is arranged in the region of the pupil of the projection lens, by way of a tilt angle optimization and optionally by way of displacing the stop in the y-direction and/or z-direction, which correspond to the object displacement direction and the optical axis, respectively. Here, better results are achieved than with non-tilted stops arranged in the paraxial pupil plane. Furthermore, the telecentricity and trefoil can additionally be improved.

The magnitude of the tilt angle $\alpha_0$ of the tilted, circular stop generally lies in the range between 1° and 20°, preferably in the range between 5° and 15°. The tilt angle $\alpha_0$ can be just as large as an angle $\alpha_{CR}$ between the chief ray 16 of the central field point and the optical axis oA.

The exemplary embodiments of the imaging optical units described above each have mirrors M1, M2, . . . , which can be described by way of an asphere equation, i.e. which have rotationally symmetric reflection surfaces, which are used in parts, in relation to the optical axis oA. Alternatively, an imaging optical unit not depicted in a figure can be used with an aperture stop arranged with an appropriate tilt, which optical unit contains at least one mirror embodied as a free-form surface. Examples of such free-form surfaces are described in the following publications: WO 2014 000 970 A1, WO 2013/174 686 A1, US 2013/0 088 701 A1, US 2013/0 070 227 A1, US 2012/0 274 917 A1, U.S. Pat. No. 8,018,650 B2, U.S. Pat. No. 8,810,903, US 2013/0 342 821 A1, U.S. Pat. No. 7,414,781 B2, U.S. Pat. No. 7,719,772 B2, US 2012/0 188 525 A1, U.S. Pat. No. 8,169,694 B2.

For the purposes of producing a microstructured or nanostructured component, the projection exposure apparatus 1 is used as follows: initially, the reflection mask 10 or the reticle and the substrate or the wafer 13 are provided. Subsequently, a structure on the reticle 10 is projected onto a light-sensitive layer of the wafer 13 with the aid of the projection exposure apparatus 1. Then, by developing the light-sensitive layer, a microstructure or nanostructure is generated on the wafer 13 and hence the microstructured component is generated.

A number of embodiments are described. Other embodiments are in the claims.

What is claimed is:

1. An imaging optical unit for EUV projection lithography for imaging an object field in an object plane into an image field in an image plane, the imaging optical unit comprising:
a plurality of mirrors for guiding imaging light from the object field to the image field;
an aperture stop, which is tilted by at least 1° relative to a normal plane which is perpendicular to an optical axis,
wherein the aperture stop is configured with a circular stop contour,
wherein the aperture stop is arranged in such a way that the following applies to mutually perpendicular planes: a deviation of a numerical aperture NAx measured in one of these planes from a numerical aperture NAy measured in the other one of these two planes is less than 0.003, averaged over the field points of the image field.

2. The imaging optical unit of claim 1, wherein the stop is arranged at a distance from, or tilted relative to, a plane, in which coma rays of the imaging light from spaced apart field points intersect.

3. The imaging optical unit of claim 1, wherein the aperture stop is arranged at a distance from, or tilted relative to, a plane, in which chief rays of the imaging light from spaced apart field points intersect.

4. The imaging optical unit of claim 1, wherein a centre of the aperture stop is at a distance from a reference axis of the imaging optical unit.

5. The imaging optical unit of claim 1, wherein the aperture stop is tilted about a tilt axis which is perpendicular to a tilt normal plane,
which contains an object displacement direction for an object arrangeable in the object plane and
with at least one field plane being perpendicular thereto.

6. The imaging optical unit of claim 1, wherein the tilt angle is less than 20°.

7. The imaging optical unit of claim 1, wherein the aperture stop is tilted in such a way that an angle of a stop normal relative to a chief ray of a central field point becomes smaller in comparison with an angle of the optical axis relative to the chief ray of the central field point.

8. The imaging optical unit of claim 1, wherein the aperture stop is tilted in such a way that an angle of a stop normal relative to a chief ray of a central field point becomes larger in comparison with an angle of the optical axis relative to the chief ray of the central field point.

9. The imaging optical unit of claim 1, wherein the aperture stop is configured as a planar stop.

10. The imaging optical unit of claim 1, wherein at least one of the mirrors has a reflection surface embodied as a free-form surface.

11. The imaging optical unit of claim 1, further comprising a tilt drive, to which the aperture stop is connected for the purposes of tilting.

12. An optical system, comprising:
the imaging optical unit of claim 1; and
an illumination optical unit for illuminating the object field with illumination light or imaging light.

13. A projection exposure apparatus, comprising:
the optical system of claim 12; and
a light source for generating EUV illumination light or imaging light;
an object holder with an object displacement drive; and
a substrate holder for holding a wafer, arrangeable in the image field, with a wafer displacement drive.

14. A method for producing a structured component, comprising:
providing a reticle and a wafer;
projecting a structure on the reticle onto a light-sensitive layer of the wafer with the aid of the projection exposure apparatus of claim 13; and
generating a structure on the wafer.

\* \* \* \* \*

UNITED STATES PATENT AND TRADEMARK OFFICE
CERTIFICATE OF CORRECTION

PATENT NO. : 9,625,827 B2  
APPLICATION NO. : 14/945837  
DATED : April 18, 2017  
INVENTOR(S) : Johannes Ruoff and Josef Rapp Page 1 of 1

It is certified that error appears in the above-identified patent and that said Letters Patent is hereby corrected as shown below:

Column 21  
Line 36, delete "FIG. 1from" and insert -- FIG. 1 from --

Column 22  
Line 44, in Claim 1, delete "NAx" and insert -- $NA_x$ --  
Line 45, in Claim 1, delete "NAy" and insert -- $NA_y$ --

Signed and Sealed this  
Twenty-seventh Day of June, 2017

Joseph Matal  
*Performing the Functions and Duties of the*  
*Under Secretary of Commerce for Intellectual Property and*  
*Director of the United States Patent and Trademark Office*